United States Patent
Engel et al.

(10) Patent No.: US 10,903,396 B1
(45) Date of Patent: Jan. 26, 2021

(54) LAYERED MATERIAL BASED QUANTUM LIGHT EMITTING DEVICE

(71) Applicants: International Business Machines Corporation, Armonk, NY (US); Cambridge Enterprise Ltd., Cambridge (GB)

(72) Inventors: Michael Engel, Rio de Janeiro (BR); Mathias B. Steiner, Rio de Janeiro (BR); Andrea C. Ferrari, Cambridge (GB); Antonio Lombardo, Papworth Everard (GB); Matteo Barbone, Munich (DE); Mete Atature, Cambridge (GB); Carmen Palacios Berraquero, London (GB); Dhiren Manji Kara, Potters Bar (GB); Ilya Goykhman, Technion (IL)

(73) Assignees: INTERNATIONAL BUSINESS MACHINES CORPORATION, Armonk, NY (US); CAMBRIDGE ENTERPRISE LTD., Cambridge (GB)

( * ) Notice: Subject to any disclaimer, the term of this patent is extended or adjusted under 35 U.S.C. 154(b) by 0 days.

(21) Appl. No.: 16/545,615

(22) Filed: Aug. 20, 2019

(51) Int. Cl.
*H01L 29/06* (2006.01)
*H01L 33/46* (2010.01)
(Continued)

(52) U.S. Cl.
CPC .......... *H01L 33/465* (2013.01); *H01L 33/005* (2013.01); *H01L 33/0041* (2013.01);
(Continued)

(58) Field of Classification Search
USPC ........................................................ 257/13
See application file for complete search history.

(56) References Cited

U.S. PATENT DOCUMENTS

| 7,903,338 B1 | 3/2011 | Wach |
| 8,053,782 B2 | 11/2011 | Avouris et al. |
| (Continued) | | |

FOREIGN PATENT DOCUMENTS

| CN | 107919604 A | 6/2018 |
| CN | 207559266 U | 6/2018 |
| KR | 101573867 B1 | 12/2015 |

OTHER PUBLICATIONS

Lo et al. (2014). Secure quantum key distribution. Nature Photonics, 8(8), 595. May 20, 2015. arXiv:1505.05303v1.

(Continued)

*Primary Examiner* — Brook Kebede
(74) *Attorney, Agent, or Firm* — Garg Law Firm, PLLC; Rakesh Garg; Joseph Petrokaitis

(57) ABSTRACT

A quantum light emitting device includes a carrier substrate, an insulator, a first semiconductor device, a second semiconductor device, a first contact, and a second contact. The quantum light device includes a carrier substrate comprising silicon and configured with an electrically insulating top surface. The quantum light device also includes an insulator configured on the carrier substrate. The quantum light device includes a first semiconductor structure comprising a first semiconductor material configured on the insulator. Further, the quantum light device includes a second semiconductor structure comprising a second semiconductor material configured on the insulator, with an overlap region of the second semiconductor structure electrically coupling with the first semiconductor structure, a dimensional characteristic of the overlap region being configured to limit a photon emission from the overlap region to a single photon.

20 Claims, 24 Drawing Sheets

(51) Int. Cl.
  *H01L 33/06* (2010.01)
  *H01L 33/00* (2010.01)
  *H01L 33/38* (2010.01)

(52) U.S. Cl.
  CPC .............. *H01L 33/06* (2013.01); *H01L 33/38* (2013.01); *H01L 2933/0016* (2013.01); *H01L 2933/0025* (2013.01)

(56) References Cited

U.S. PATENT DOCUMENTS

| | | |
|---|---|---|
| 8,270,841 B2 | 9/2012 | Nishioka et al. |
| 8,476,739 B2 | 7/2013 | Okai et al. |
| 8,507,893 B2 | 8/2013 | Okai |
| 8,610,989 B2 | 12/2013 | Avouris et al. |
| 9,784,888 B2 | 10/2017 | Naik et al. |
| 9,819,418 B2 | 11/2017 | Nordholt et al. |
| 2011/0164843 A1* | 7/2011 | Hochberg ............... G02F 1/025 385/2 |
| 2015/0372159 A1* | 12/2015 | Englund .................. G01J 3/18 356/328 |
| 2017/0309769 A1 | 10/2017 | Engel et al. |

OTHER PUBLICATIONS

Heindel et al. (2012). Quantum key distribution using quantum dot single-photon emitting diodes in the red and near infrared spectral range. New Journal of Physics, 14(8), 083001, IOP Publishing Ltd and Deutsche Physikalische Gesellschaft.

\* cited by examiner

*FIGURE 5*
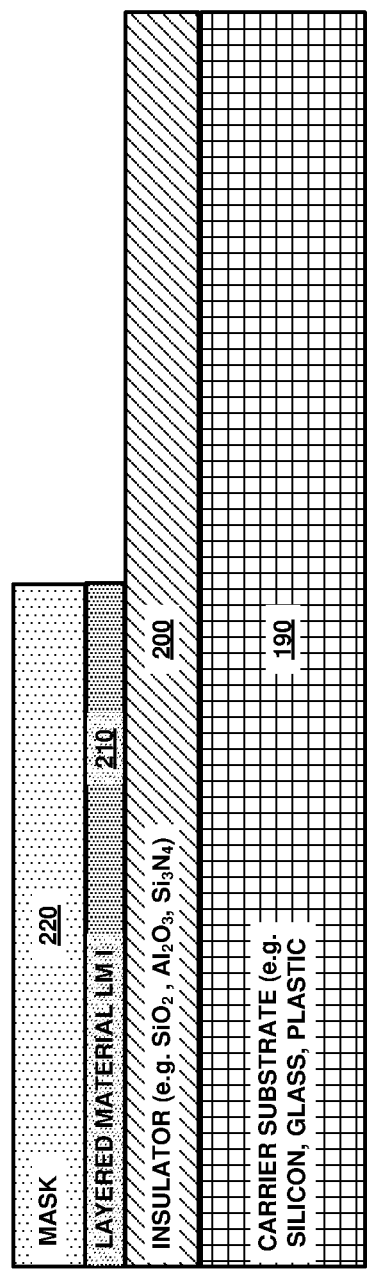
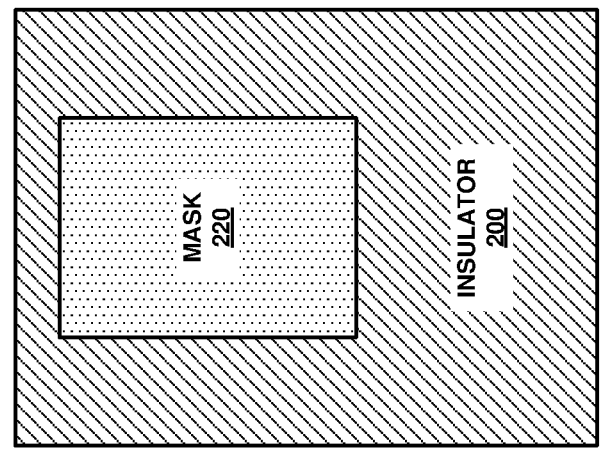

though an optical fiber coupling. Yet another
LAYERED MATERIAL BASED QUANTUM LIGHT EMITTING DEVICE The project leading to this application has received funding from the European Union's Horizon 2020 research and innovation programme under grant agreement Nos 649953, 696656 & 785219; and from the European Union Seventh Framework Programme under grant agreement 319277 & 617985.

TECHNICAL FIELD

The present invention relates generally to single photon emission in a quantum light emitting diode (QLED) device. More particularly, the present invention relates to an enhanced single photon emission in a Layered Material QLED (LM QLED) device.

BACKGROUND

A problem with quantum communication networks is the secure exchange of information. A quantum communication network is a network where a communication of non-binary data (quantum data) occurs. At this time, known solutions for attempting to provide secure communication in such a quantum network or the like are prone to eavesdropping by outside sources. Other problems with ensuring secure communication include a lack of electrically controlled single photon generation or integration compatibility within standard platform technologies for large-scale device manufacturing. The electrical control includes maintaining control of the transmission of the quantum data between the multiple parties involved. Still another problem includes materials with limited electrical injection capabilities such as quantum dots, color centers, or spectral and spatial tuneability of the emission center. The limited ability of electrically controlled single photon generation do not allow for a secure enough transmission of the quantum data between multiple parties.

A solution to these problems in quantum communication networks is needed that can enable secure communication while mitigating eavesdropping or lack of electrical electrically controlled single photon generation, and while improving fabrication with materials with limited electrical injection capabilities. The illustrative embodiments recognize that a QLED device that can provide a single photon emitter to provide a single photon emission through layered semiconductor materials with a new class of materials for integrated electronics and photonic applications can provide a solution that mitigate the known problems of the current solutions.

An integrated heterostructure diode or electrostatically controlled p-n diode can be created through a CMOS compatible manufacturing processes. The integrated heterostructure diode or electrostatically controlled p-n diode is a light emitting diode (LED) in the QLED device that will emit the light in response to a received current. A diode of this type is embedded in an optical cavity that confines the photon emission location. The optical cavity confines the photon emission by using one or more mirrors or substrates to allow only photons of a certain frequency to escape. As a result, confining the photon emission location can enhance and redirect single photon emission at a resonant design wavelength. The resonance wavelength is the natural resonance frequency of the optical cavity. A design rule can relate the optical bandgap of the layered material in the QLED device with the resonance wavelength of the optical cavity. As a result, the emission wavelength can be tuned based on the resonance wavelength.

The illustrative embodiments recognize that secure communication can be achieved thru single photon emission that is localized using a variety of layered materials to induce the localization of the photon emission and spatially filter the photon emission.

Electrically controlled single photon emission can provide advantages such as spectral selectivity provided by an integrated optical cavity. Another advantage can be emission enhancement at the cavity resonance wavelength. In addition, there can be emission collimation at the cavity resonance for improved optical fiber coupling. Yet another advantage can be scale in device manufacturing through integration with processes known to the industry.

QLED devices can include layered materials with a specific region of the layered materials to be designated for single photon emissions. Illustrative embodiments show how portions or regions of the layered materials are designated for the single photon emissions. The photon emissions can be further localized and spatially filtered by adjusting the layered materials to further localize the emission region and adding one or more masks to spatially filter the photon emission.

The illustrative embodiments depict that induced localization of photon emissions can occur by placing substrate induced elements to limit the area within which the photon emission occurs. Applying one or more materials in a main insulator can limit the area in which the photon emission occurs. Placing additional devices and materials within the emission region can ensure an induced localization within the emission region. The induced localization can ensure that the emission stays localized within the area at which the induced localization occurs. A variety of QLED devices with many variations of layered materials can help provide the induced localization of the single photon emission.

The illustrative embodiments further recognize that spatially filtering the single photon emission can provide additional advantages as well. One or more filters or masks can be placed either above and/or below the region in which the emissions take place to provide a further filter for the photon emission and an enhanced photon emission as a result of the filter. Hard and soft filters are applied to achieve this spatial filtering. As with the induced localization, the spatial filtering can be done by a number of QLED devices.

The illustrative embodiments also further recognize that photon emission is also enhanced by confining the area at which the photon emission occurs. In the absence of filters or specific layered elements that can provide spatial filtering or induced localization in the emission region, the layered materials within the QLED device can be manually adjusted as required to manually reduce the area or region at which the emission takes place. As with the spatial filtering, the reducing the emission region can be done by a variety of QLED devices.

Various materials and variations of layered materials can be used to achieve the spatially confined emission, the induced localization emission, and also the spatial filtered emission. One or more of the QLED devices which incorporate one or all of the features that lead to the spatially confined emission, induced localization emission, and spatially filtered emission is needed to solve the aforementioned problems existing today in quantum networks.

SUMMARY

The illustrative embodiments provide a quantum light emitting device for single photon emission through an overlapping region with a device, method and system therefor. An embodiment provides a quantum light emitting device. The embodiment includes a carrier substrate comprising silicon and configured with an electrically insulating top surface. The embodiment includes an insulator configured on the carrier substrate. The embodiment includes a first semiconductor structure comprising a first semiconductor material configured on the insulator. The embodiment includes a second semiconductor structure comprising a second semiconductor material configured on the insulator, with an overlap region of the second semiconductor structure electrically coupling with the first semiconductor structure, a dimensional characteristic of the overlap region being configured to limit a photon emission from the overlap region to a single photon. The embodiment includes a first contact electrically coupled with the first semiconductor structure to provide a negative charge at the overlap region. The embodiment includes a second contact electrically coupled with the second semiconductor structure to provide a positive charge at the overlap region. Thus, the embodiment provides a quantum light emitting device that avoids the problems of prior know solutions that were prone to eavesdropping or lack of electrical control or integration compatibility or that contained materials with limited electrical injection capabilities.

In another embodiment, light is emitted over the overlap region between the second semiconductor structure and the first semiconductor structure. Thus, the embodiment provides a quantum light emitting device that can emit light over the overlap region.

In another embodiment, the quantum light emitting device has a set of voids configured in the insulator, wherein a void in the set of voids is configured to enhance photon emission in the overlap region by causing the photon emission in the overlap region to be further localized. Thus, the embodiment provides voids in the insulator to provide a more localized photon emission.

In another embodiment, wherein the insulator is configured with an additional insulator in a set of voids within the insulator to further localize the single photon emission in the overlap region Thus, the embodiment provides an additional insulator in a set of voids to provide a more localized photon emission.

In another embodiment, wherein the insulator is configured with a set of voids to enhance or to localize the single photon emission in the overlap region. Thus, a set of voids can be placed in the insulator to further localize and enhance the photon emission in the overlap region.

In another embodiment, wherein a dimension of the overlap region is adjusted between the first semiconductor structure and the second semiconductor structure to further localize the photon emission. Thus, in an embodiment, an adjustment in a dimension of the overlap region further localizes the photon emission.

Another embodiment further includes wherein a void from the set of voids is axially aligned with the overlap region. Thus, the embodiment provides void to be axially aligned with the overlap region to further localize the photon emission.

An embodiment provides a method for enhancing photon emission in a quantum light emitting device.

An embodiment provides a photon emission system that can be formed using a quantum light emitting device disclosed herein.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 5 depicts another step in an example process of forming a quantum light emitting structure in accordance with an illustrative embodiment;

DETAILED DESCRIPTION

Figure 1:
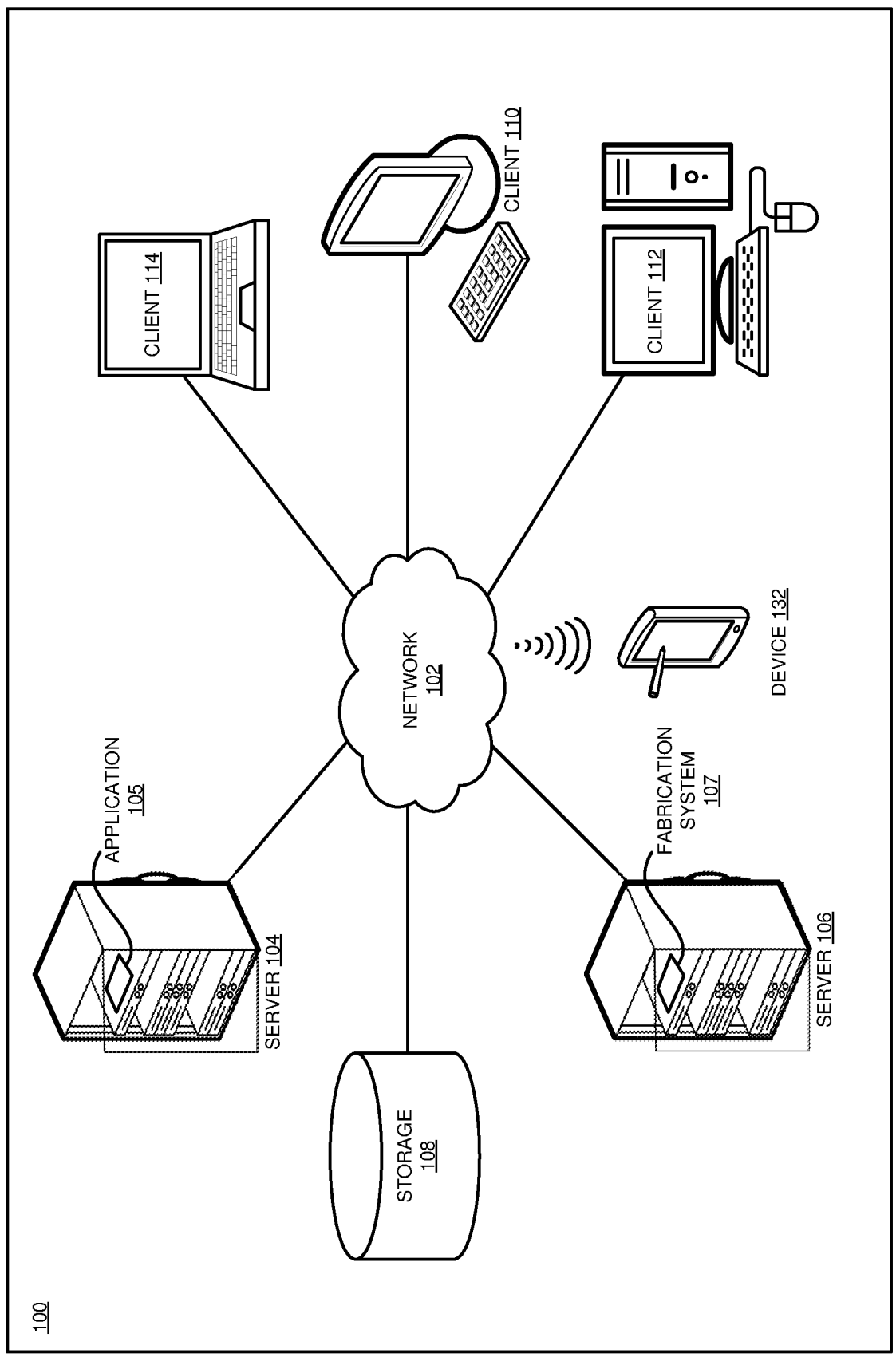
FIG. 1 depicts a block diagram of a network of data processing systems in which illustrative embodiments may be implemented.

The illustrative embodiments used to describe the invention generally address and solve the above-described problems or needs and other related problems or needs by providing a quantum light emitting diode (QLED) device for single photon emission. The illustrative embodiments also provide a QLED device, method and system to produce a more enhanced and localized single photon emission.

An embodiment includes a carrier substrate that is made up of silicon, glass or plastic. The illustrative embodiments do not restrict what the carrier substrate consists of. In an illustrative embodiment, the carrier substrate is made of silicon. An insulator is configured onto the carrier substrate. The insulator is made up of silicon oxide. The illustrative embodiments do not restrict what the insulator consists of. The insulator can also consist of aluminum oxide or silicon nitride.

An embodiment adds a layered material such as a two-dimensional semiconductor device onto the insulator. The semiconductor device is configured over the insulator, and the insulator is configured over the carrier substrate. A further embodiment adds a mask over the semiconductor device. The mask can be used to act as a filter during a single photon emission. The mask can be a hard or soft filter. In this embodiment, the mask acts as a hard filter. After the mask, another two-dimensional layer material or semiconductor device is added to the structure. The second semiconductor device is configured over the insulator and mask and first semiconductor device. The second semiconductor device has an overlapping region with the first semiconductor to allow for a single photon emission. The overlapping region is the only region in which the second semiconductor device overlaps with the first semiconductor device. The single photon emission takes place in this overlapping region. In another embodiment, a second mask is added to the current structure. The second mask is configured over the second semiconductor device, the first mask, and the first semiconductor device. In this embodiment, the second mask is a hard filter. The second mask is configured over the overlap region between the first and second semiconductor device and the mask. Both the first mask and the second mask will help provide a more localized and enhanced photon emission by providing a spatial filter for the photon emission. In an embodiment, the diameter of the overlap region is also narrowed to provide a more localized photon emission.

Another embodiment does not utilize either a first or second mask to provide spatial filtering of the photon emission. The device can also just include the carrier substrate, insulator, and first and second semiconductor device. The overlap region between the first semiconductor device and the second semiconductor device can be adjusted by being narrowed further to spatially confine the active area within the overlap region at which the photon emission will occur.

Another embodiment uses a single mask instead of two masks to spatially filter the photon emission. The single mask is configured above the second semiconductor device (or second layered material) and over the overlap region. The mask then spatially filters the photon emission through the overlap region to enable the photon emission to be more enhanced and localized.

These examples of the QLED device are not intended to be limiting. From this disclosure, those of ordinary skill in the art will be able to conceive many other manners and the same are contemplated within the scope of the illustrative embodiments. For example, an implementation can employ many different semiconductor layers and several masks provided there is an overlap region at which the photon emission can occur, and wherein that region can be localized or spatially filtered. Only for the clarity of the description and without implying any limitation thereto that only two semiconductor devices and two masks were described above.

A variety of methods of are usable with the illustrative embodiments. For example, one embodiment uses the carrier substrate, insulator and the first semiconductor device and the second semiconductor device. The overlap region exists in the region where the second semiconductor device overlaps with the first semiconductor device. A first ground contact and a second ground contact are added onto the first semiconductor device and the second semiconductor device respectively. The first ground contact emits a negative charge, while the second ground contact emits a positive charge for a p-n junction. As a result, a single photon emission occurs within this overlap region. The active area within this overlap region can be reduced to ensure that the single photon emission is more localized.

Another embodiment adds another feature to the embodiment described previously above. A plurality of air holes can be placed within the insulator. One or more of the plurality of air holes can be placed underneath the overlap region where the photon emission is to occur. The effect of the air holes underneath the overlap region provides an inducted localization as the critical area of the overlap region is equal to the diameter of the one or more air holes that are configured underneath the overlap region. Consequently, the single photon emission is within this diameter, and is more localized as a result.

A further embodiment uses another insulator grouped into separate and smaller intervals and configured within the main insulator. The second insulator is made up of different material and is different from the main insulator. Like the air holes in the prior embodiment, the new insulator provides an induced localization of the critical area within the overlap region. The photon emission through the overlap area is more localized and enhanced to a greater extent than the induced localization of the air holes. In other embodiments, the insulator can also be configured with intervals of a second insulator and the air holes to enable the induced localization of the overlap region.

An embodiment depicts where top slit gates can be added on top of the second semiconductor device (second layered material) to reduce the critical area of the overlap region. With the ground contacts and the two semiconductor devices forming the p-n junction, the photon emission is limited or spatially confined to this critical area within the overlap region. In additional illustrative embodiments, the plurality of air holes and additional intervals of other insulators can be configured within the main insulator to have an induced localization of the photon emission within the overlapping region. The photon emission can be more enhanced and localized.

Another embodiment provides additional spatial filtering of the photon emission by adding first and second cavity mirrors that are configured either underneath and above the overlap region of the first and second semiconductor device. In additional, a first intra-cavity dielectric and second intra-cavity dielectric are also placed below and above the overlap region to provide additional spatial filtering for the photon emission. In such a design, the insulator need not require air holes or an additional insulator to provide a further localization of the photon emission. The critical area within the overlap region can still be adjusted inspite of the additions of the first and second intra-cavity dielectrics and first and second cavity mirrors. Other embodiments can include the same materials for the QLED, but also include air holes or an additional insulator configured within the insulator to provide an induced localization of the photon emission within the overlap region.

In an embodiment, the thickness of the first and second cavity mirrors are made of Gold, with the thickness of the second cavity mirror being greater than the thickness of the first cavity mirror to provide more spatial filtering for the photon emission. In addition, the first semiconductor device at the center of the overlap region is made of Tungsten Selenide while the first and second intra-cavity dielectrics and the second semiconductor device are made of aluminum oxide. Moreover, the combined thickness of the first and second intra-cavity dielectrics and the second semiconductor device is equal to the emission wavelength of the first semiconductor device that is made of Tungsten Selenide.

Overall, the design constraint for achieving enhanced and localized single photon emission in a QLED device are done in a variety of methods based on the embodiments described below. The active area within the overlap region in which the photon emission occurs is spatially confined at the location where both the first and second semiconductor devices (layered materials) overlap. The overlap region is reduced to an area that is smaller than the critical area to provide a more localized photon emission. Another induced localization occurs when air holes or other insulators within the main insulator are configured underneath the overlap region to limit the area of the photon emission to the diameter of the air hole or second insulator underneath the overlap region. Further, one or masks configured either above or below the overlap region provide spatial filtering for the photon emission to provide a more enhanced emission.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, numerosity, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical semiconducting or superconducting device. The steps described by the various illustrative embodiments can be adapted, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, thermal properties, mechanical properties, structures, formations, shapes, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure depicts an example diagram of a data processing environment in which a method of the illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Figure 2:
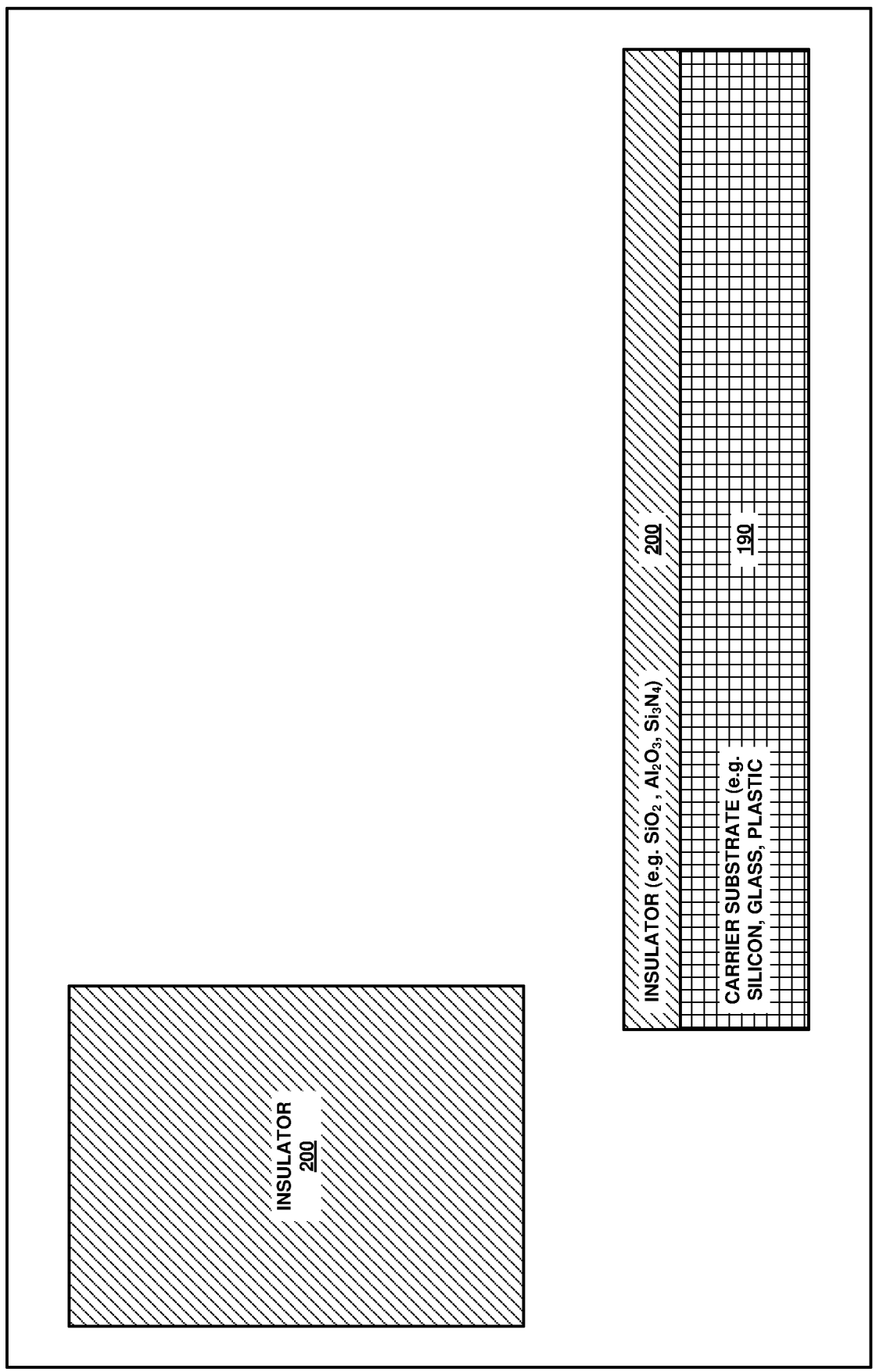
FIG. 2 depicts a side view of a substrate and insulator and a top view of an insulator in accordance with a an illustrative embodiment.

FIG. 2 depicts side view of a carrier substrate 190. The carrier substrate 200 is made of silicon. In other embodiments, the carrier substrate 190 is made of glass or plastic. An insulator 200 is configured onto the carrier substrate 200. In other embodiments to be shown below, the insulator 210 can have a plurality of air holes or another insulator configured within. A top view of the insulator 200 is also depicted in FIG. 2.

Figure 3:
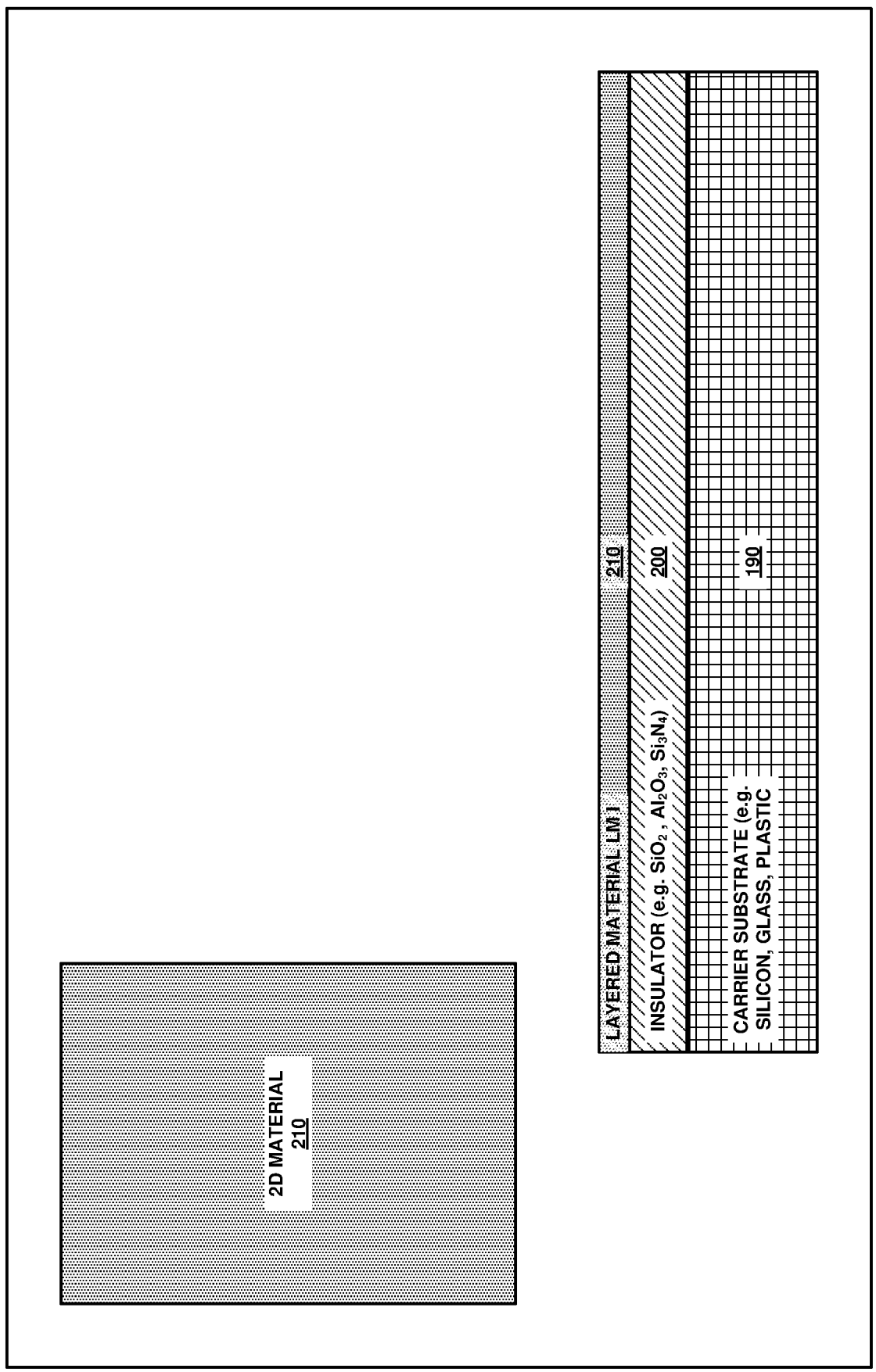
FIG. 3 depicts a side view of a substrate and carrier and a top view in an example process of forming a quantum light emitting structure in accordance with an illustrative embodiment.

With reference to FIG. 3, this figure depicts a side view of the carrier substrate, 190, insulator 200, and a layered material or first semiconductor device 210. The layered material or first semiconductor device 210 is configured above the carrier substrate 190 and the insulator 200. As will be shown in later figures, a region of the first semiconductor device 210 will be used for photon emission.

Figure 4:
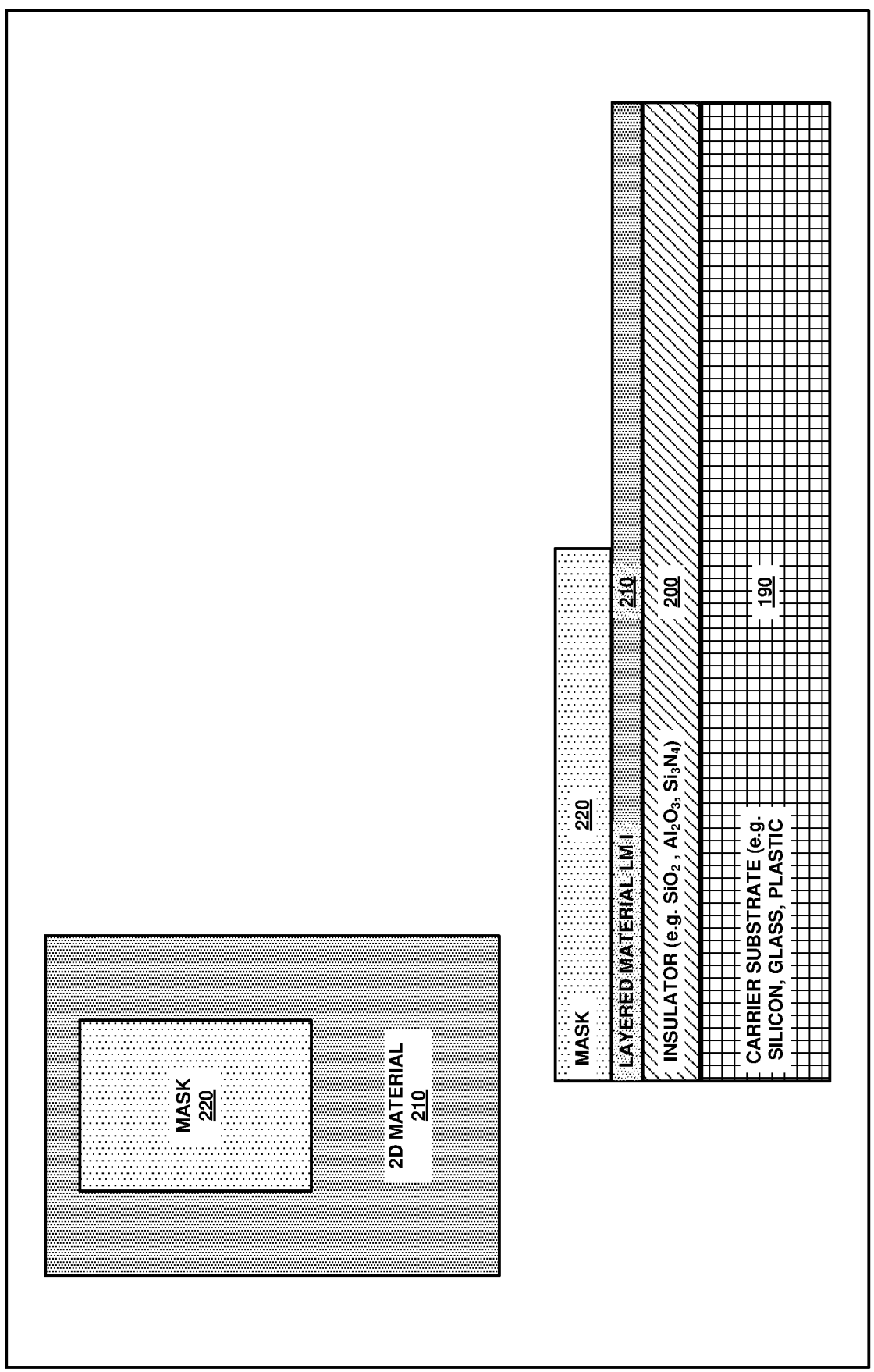
FIG. 4 depicts another side view and top view in an example process of forming a quantum light emitting structure in accordance with an illustrative embodiment.

With reference to FIG. 4, another side view of the carrier substrate 190, insulator 200, and first semiconductor device 210 is illustrated. A mask 220 is also depicted and is configured on the semiconductor device 210. The mask 220 will be used to mask a region of the first semiconductor device 210 to provide a more localized and enhanced photon emission. A top view of the mask 220 configured on semiconductor device 210 is depicted in FIG. 3, and in later Figures as well.

With reference to FIG. 5, this figure depicts side view of the carrier substrate 190, insulator 200, first semiconductor device 210 and mask 220 and represents the same or similar artifacts as described with respect to FIG. 4.

Figure 6:
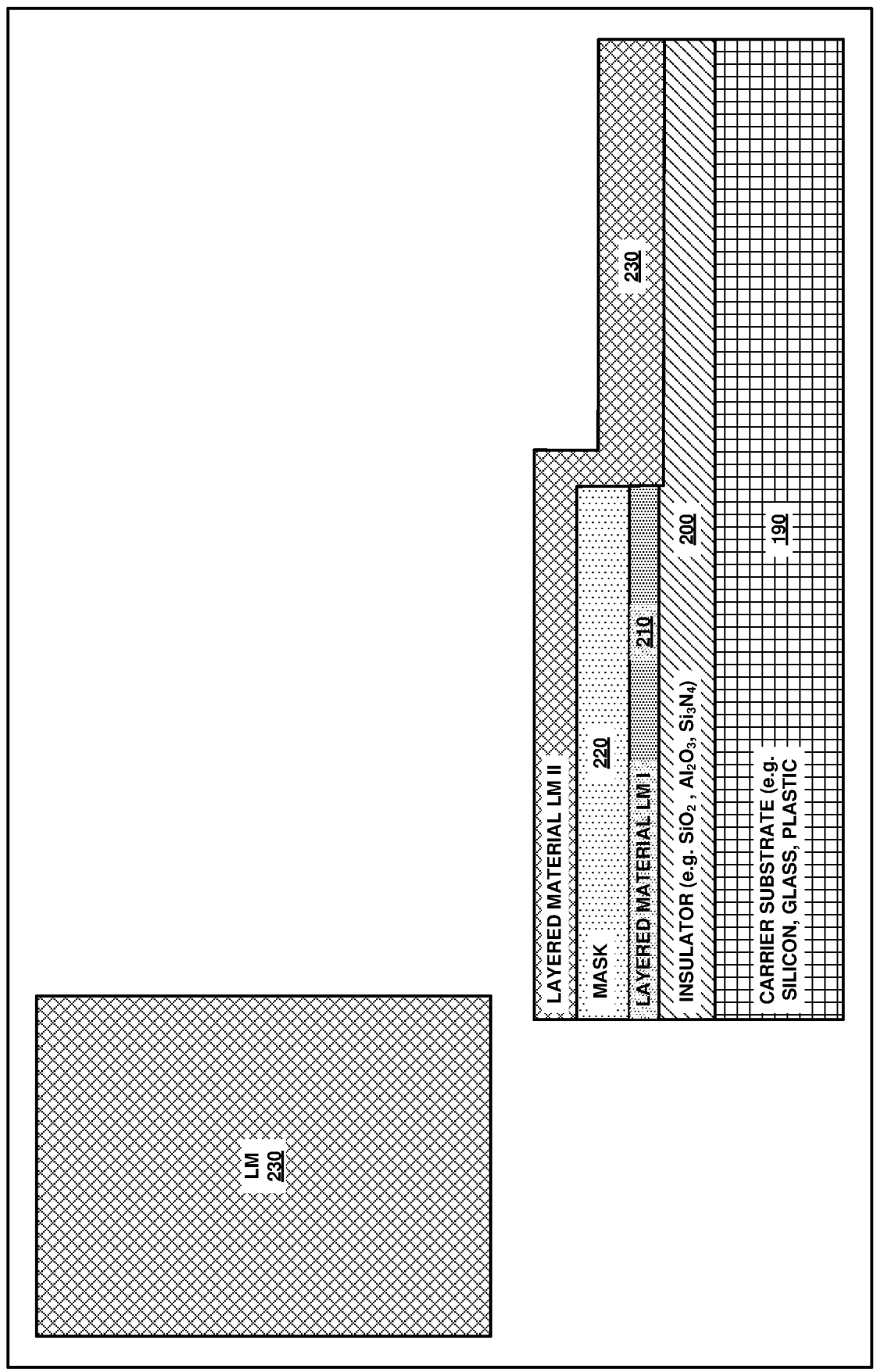
FIG. 6 depicts an example structure of in accordance with an illustrative embodiment.

With reference to FIG. 6, another side view of the carrier substrate 190, the insulator 200, first semiconductor device 210, and mask 220 is illustrated. In addition, another layered material or second semiconductor device 230 is positioned over the mask 220 and the insulator 200. Later figures will depict the second semiconductor device 230 that will have a region that will overlap with the first semiconductor device 210 to allow for localized and enhanced photon emission. The overlapping region is the only region in which the second semiconductor device 230 overlaps with the first semiconductor device, and it is the region in which the single photon emission will occur.

Figure 7:
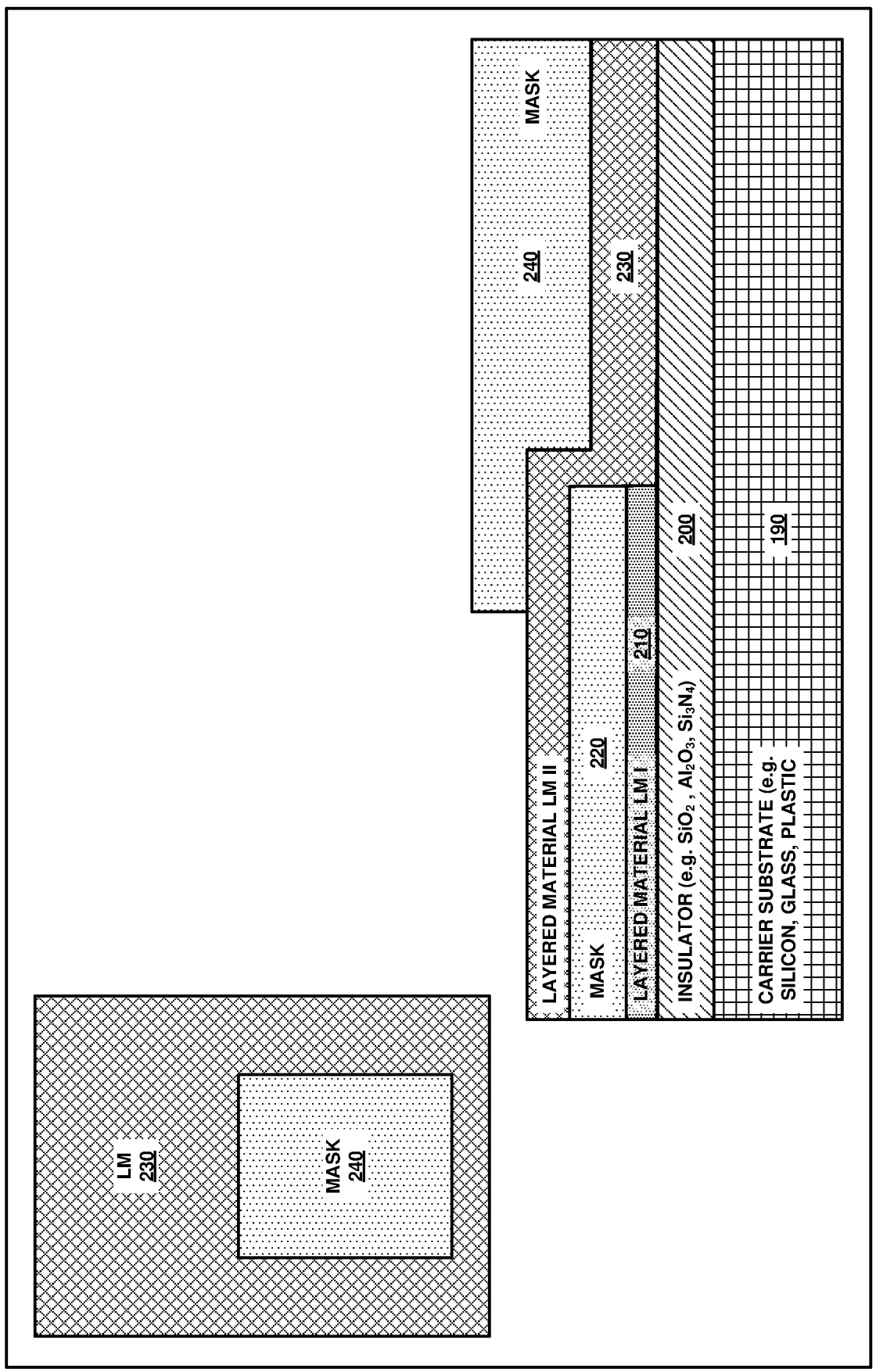
FIG. 7 depicts another example of a block diagram of a quantum light emitting structure in accordance with an illustrative embodiment.

With reference to FIG. 7, a side view of the carrier substrate 190, insulator 200, first semiconductor device 210, first mask 220, and second semiconductor device 230 is illustrated. Further, an additional or second mask 240 is configured onto the second semiconductor device 230. The second mask 240 will allow for more enhanced and localized photon emission in the region overlapping between the first semiconductor device 210 and the second semiconductor device 230. The second mask 240 will provide a hard filter for the photon emission that will spatially filter the photon emission through the overlap region. In other illustrative embodiments, the second mask 240 can provide a soft filter for the photon emission.

Figure 8:
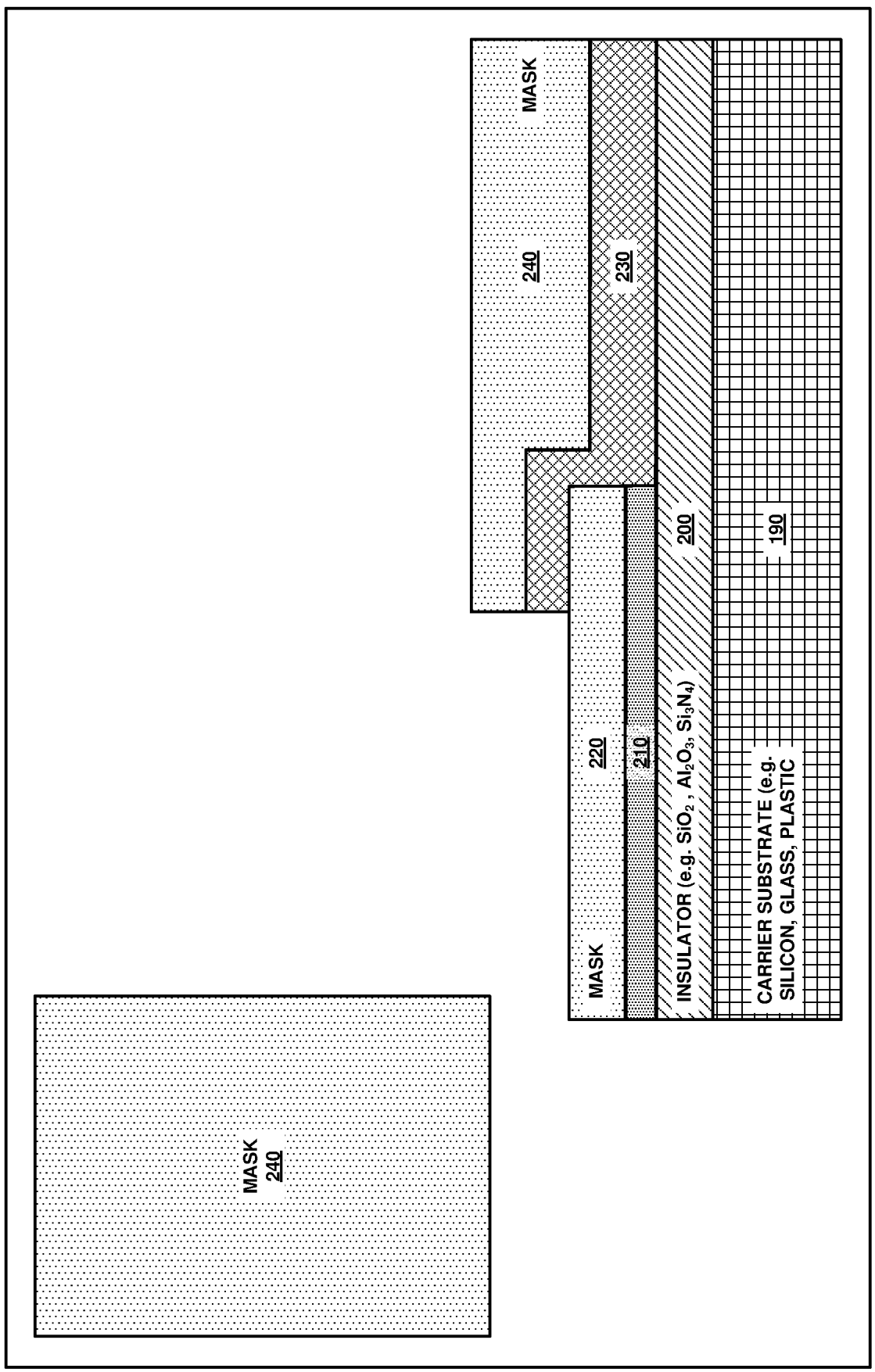
FIG. 8 depicts an additional diagram used in forming a quantum light emitting structure in accordance with an illustrative embodiment.

With reference to FIG. 8, this figure depicts side view of the carrier substrate 190, insulator 200, first semiconductor device 210, first mask 220, second semiconductor 230, and second mask 240 and represents the same or similar artifacts as described with respect to FIG. 7.

Figure 9:
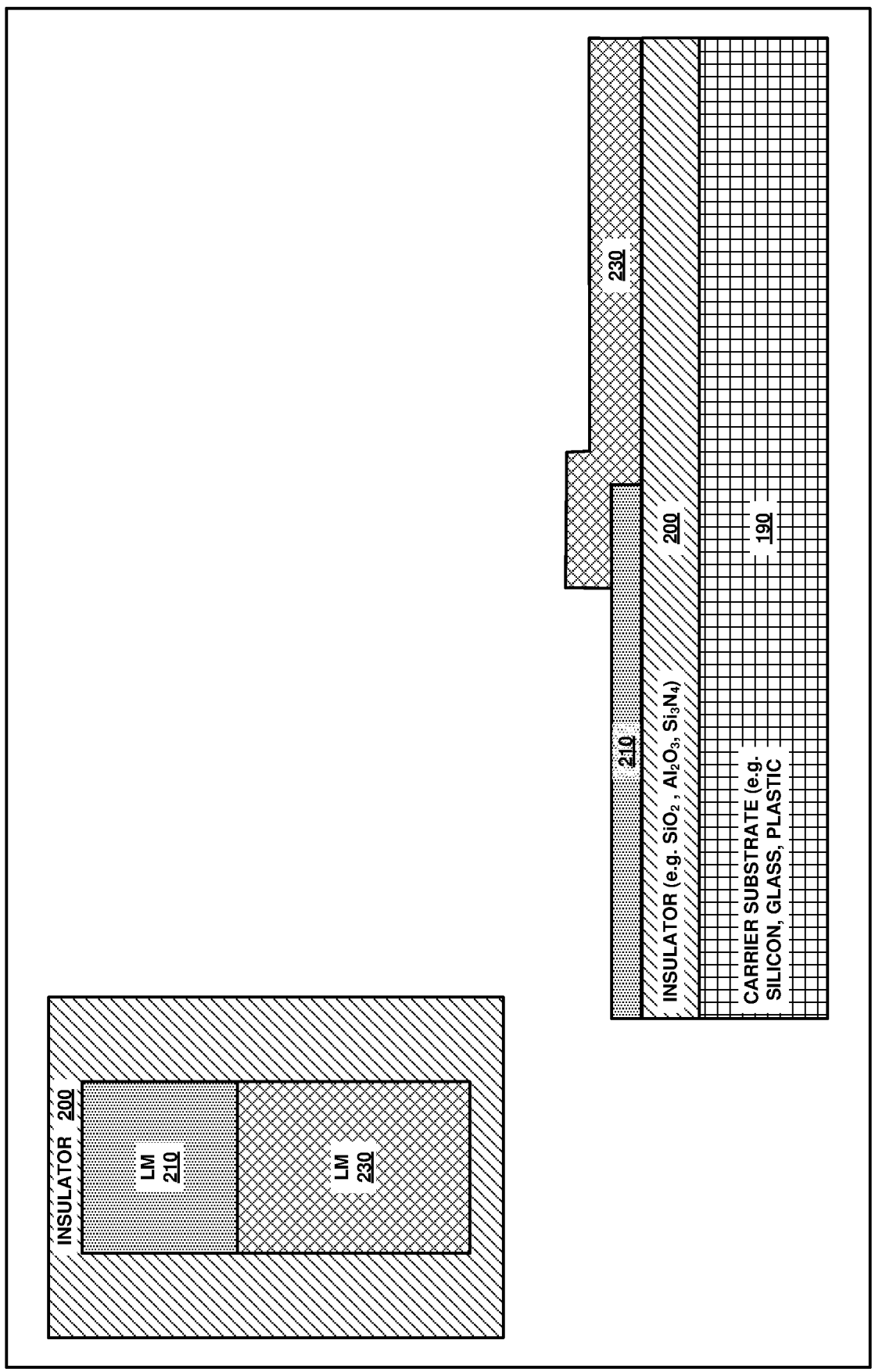
FIG. 9 depicts another example schematic diagram of a quantum light emitting device in accordance with an illustrative embodiment.

With reference to FIG. 9, the carrier substrate 190, insulator 210, first semiconductor device 210 and second semiconductor device 230 is illustrated. A portion of the second semiconductor device 230 overlaps with a region of the first semiconductor device 210, which provides the overlapping region for the single photon emission. As a result, a localized photon emission can occur in this overlapping region. The diameter of the overlapping region is 100 nm, and is narrowed when it is required or determined to be necessary to create an enhanced and more localized photon emission. Later figures will further explain the enhanced and localized photon emission.

Figure 10:
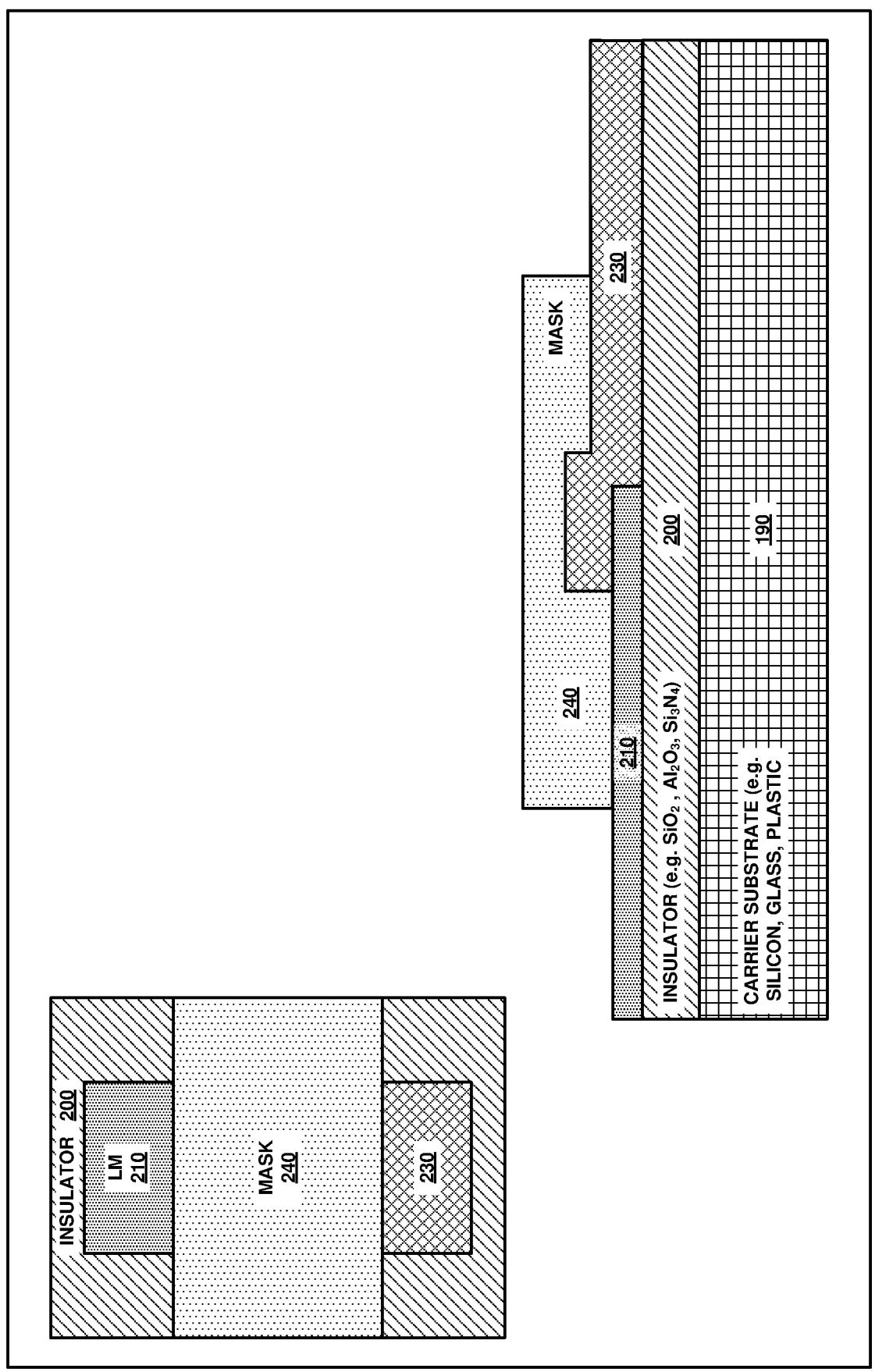
FIG. 10 depicts an example of a quantum light emitting device in accordance with an illustrative embodiment.

With reference to FIG. 10, another view of the carrier substrate 190, insulator 200, first semiconductor device 210, and second semiconductor device 230 is depicted. The second mask 240 is shown to be over the overlap region between the first semiconductor device 210 and the second semiconductor device 230. The second mask 240 provides a spatial filter for the photon emission (as described in FIG. 7) in the overlap region and allows the photon emission to be more localized and enhanced as a result.

Figure 11:
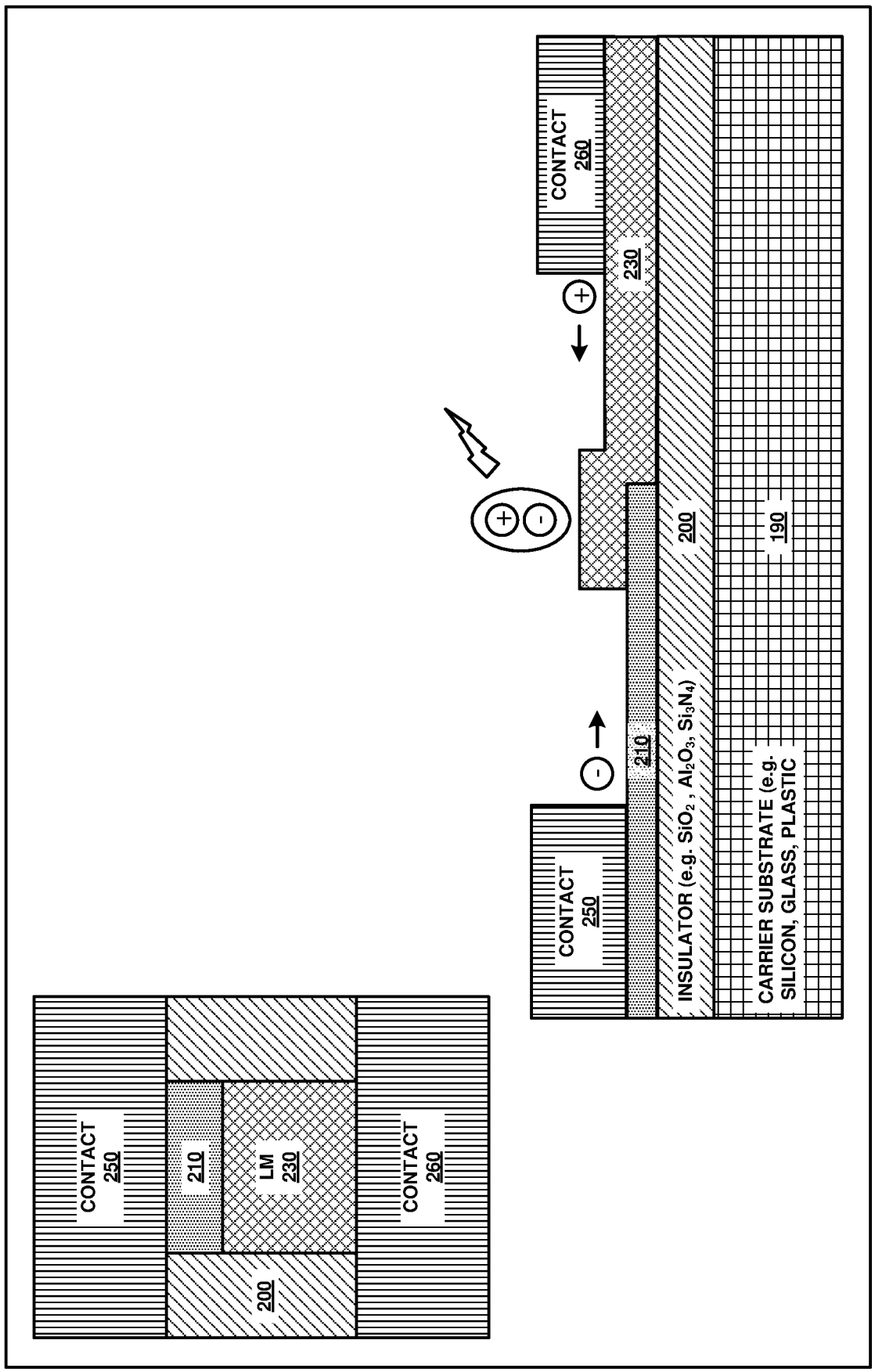
FIG. 11 depicts an additional example of a quantum light emitting device in accordance with an illustrative embodiment.

Referring to FIG. 11, a view of the elements previously described is depicted in to include a first ground contact 250 and a second ground contact 260. The insulator 200 is configured over the carrier substrate 190. The first semiconductor device 210 is then configured over the insulator 200. The second semiconductor device 230 is then configured over the insulator 200, with an overlapping region over the first semiconductor device 210. With the first ground contact 250 and the second ground contact, a p-n junction is formed. The first ground contact 250 emits a negative charge and the second ground contact 260 emits a positive charge. In other embodiments, the positive and negative charges can be emitted by either the first ground contact 250 or the second ground contact 260 respectively. Photon emission then occurs in the overlap region between the first semiconductor device 210 and the second semiconductor device 230.

The overlap region of the first semiconductor device 210 and the second semiconductor device 230 enables the photon emission to be more enhanced and localized. The diameter of the overlap region is also narrowed to provide a more enhanced and localized photon emission. The position of the second semiconductor device 230 is adjusted when needed to adjust the diameter of the overlap region to enable the photon emission to be more localized and enhanced. Light is emitted directly over this overlap region between the first semiconductor device 210 and the second semiconductor device 230. The more localized the overlap region, the more enhanced the photon emission.

In other embodiments, the second mask 240 is to be placed over the overlap region to provide a spatial filter to enable the photon emission to be more localized and enhanced. Further, in other embodiments, the insulator 200 can contain a plurality of air holes, another insulator, or a combination of a plurality of air holes and another insulator.

Figure 12A:
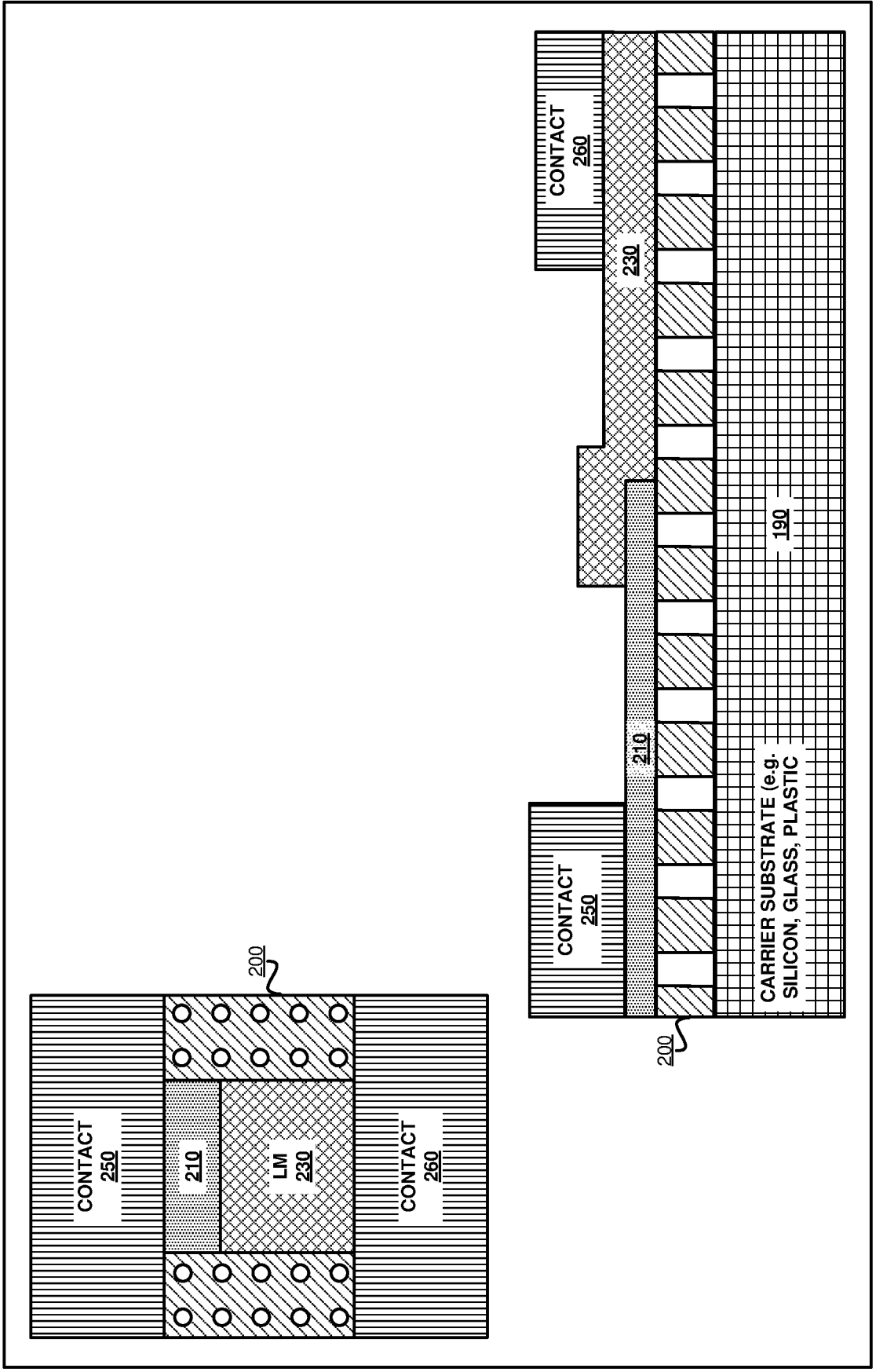
FIG. 12(A) depicts an example of enhancing photon emission in accordance with an illustrative embodiment.

With respect to FIG. 12(A), the insulator 200 is configured with a plurality of air holes. The first semiconductor device 210 is configured over the insulator 200, and the second semiconductor device 230 is also configured over the insulator, with a region of the second semiconductor device 230 overlapping with the first semiconductor device 210 to form the overlap region where the photon emission occurs. The first ground contact 250 emits a negative charge and the second ground contact 260 emits a positive charge for a p-n junction. At least one of the plurality of air holes is configured underneath the overlap region. Consequently, the photon emission within the overlap region becomes more localized and is enhanced as a result. Positioning more than one of the plurality of air holes underneath the overlap region will enable the photon emission to become more localized and more enhanced accordingly.

Figure 12B:
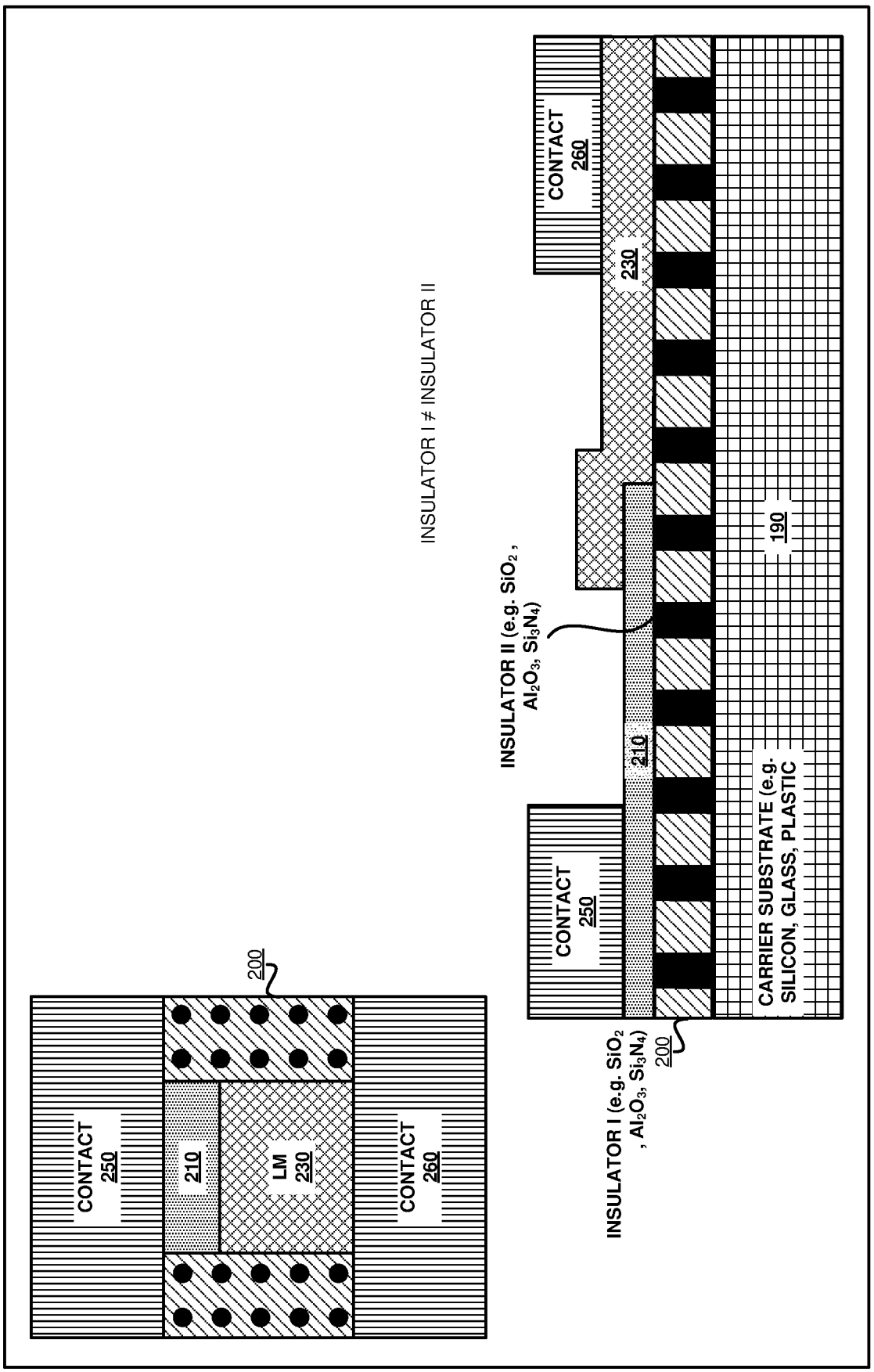
FIG. 12(B) depicts another example of enhancing photon emission in accordance with an illustrative embodiment.

With reference to FIG. 12(B), the insulator 200 is configured with a different insulator to provide a more localized and enhanced photon emission. The first semiconductor device 210 is configured on the insulator 200, and the second semiconductor device 230 is configured on the insulator 200 with an overlapping region present between the first semiconductor device 210 and the second semiconductor device 230. The first ground contact 250 emits the negative charge and the second ground contact 260 emits the positive charge. The additional insulator configured underneath the overlap region allows for a more localized area for the photon emission. As a result, the photon emission is more enhanced. The other insulator allows for a more localized photon emission than the air holes described in FIG. 12(A). In other embodiments, a plurality of the other insulators within the insulator 200 are placed underneath the overlap region. In addition, the diameter of the overlap region is also reduced when necessary to allow the photon emission to be more localized.

Figure 12C:
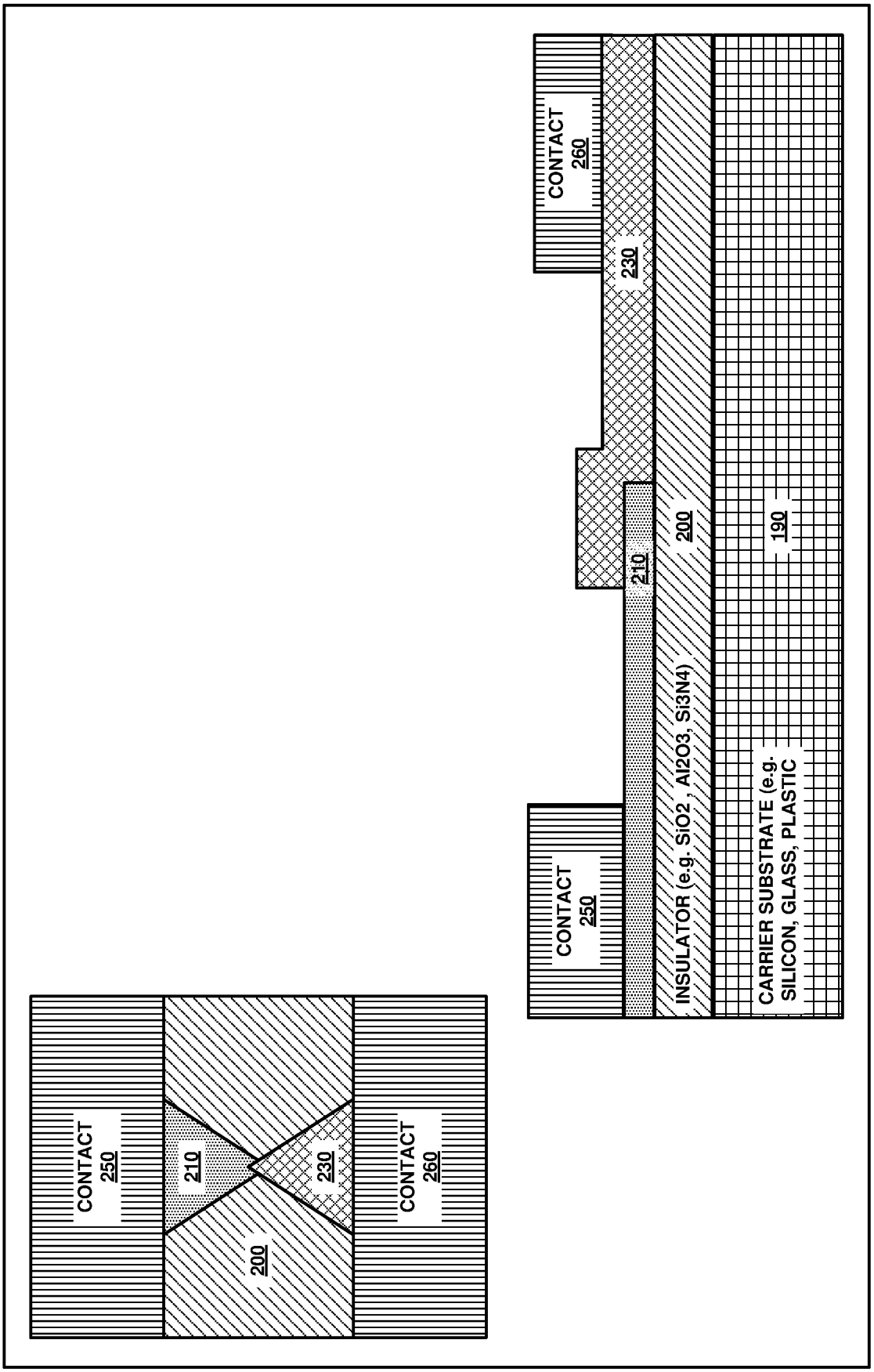
FIG. 12(C) depicts a further example of a structure for enhancing photon emission in accordance with an illustrative embodiment.

With reference to FIG. 12(C), the configuration is very similar to what was described above in FIGS. 12(A) and 12(B), with the exception that the insulator does not contain the air holes or another insulator. The overlap region between the first semiconductor device 210 and the second semiconductor device 230 is adjusted to allow for a more localized photon emission. The top view in FIG. 12(C) depicts how a lateral confinement of the overlap region localizes the photon emission. The overlap region between the first semiconductor device 210 and the second semiconductor device can be narrowed to allow for a more localized overlap region. The more localized overlap region allows for a more efficient and enhanced photon emission through the overlap region.

Figure 13A:
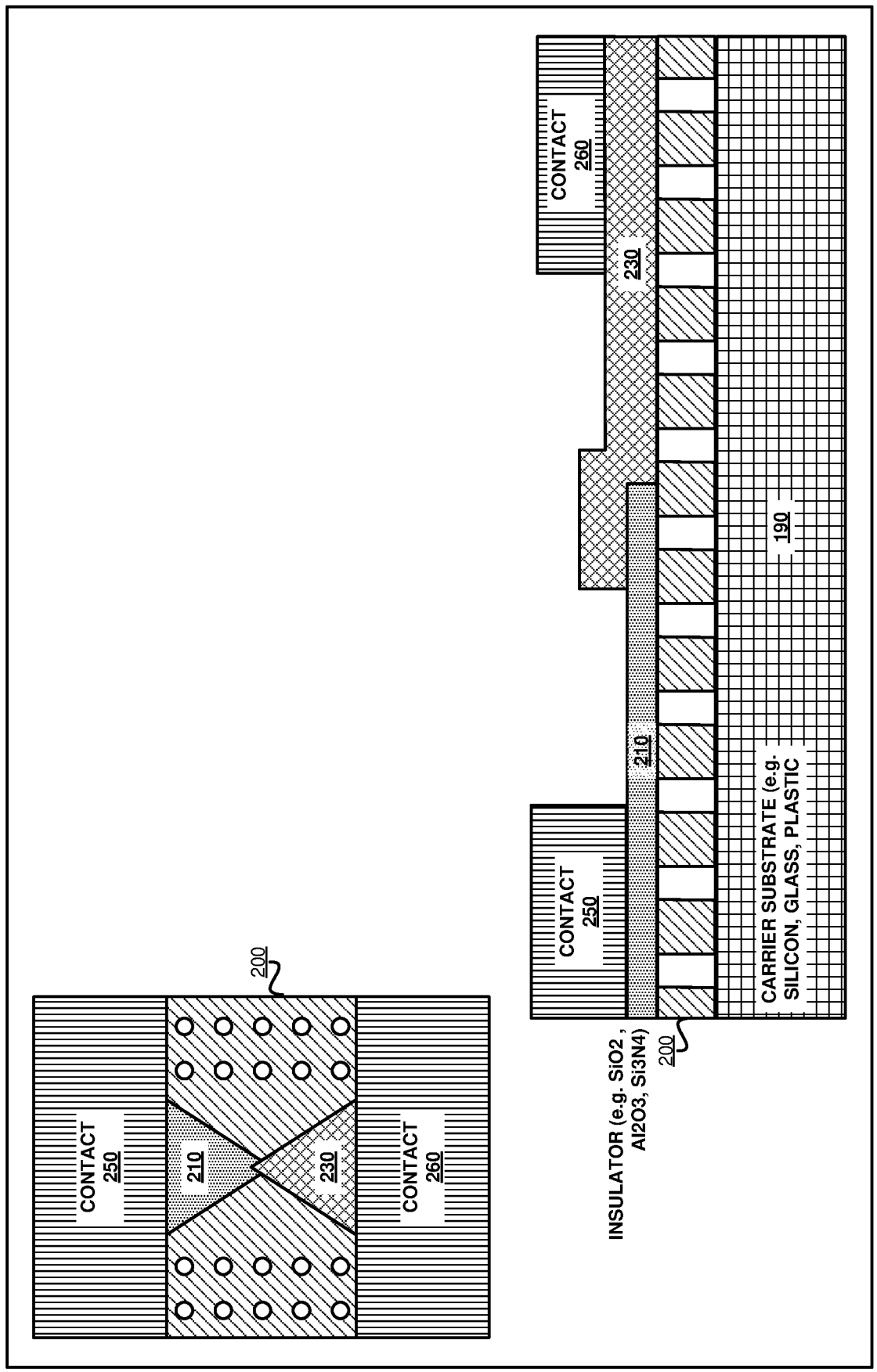
FIG. 13(A) depicts another example of a quantum light emitting structure in accordance with an illustrative embodiment.

With respect to FIG. 13(A), while the lateral confinement of the first semiconductor device 210 and the second semiconductor device 230 is present as in FIG. 12(C), a plurality of air holes is configured within the insulator 200. At least one of the plurality of air holes is placed underneath the overlap region with the lateral confinement. Accordingly, the localization of the overlap region is increased by both the lateral confinement and one or more of the air holes configured underneath the overlap region. The photon emission is more enhanced as a result.

Figure 13B:
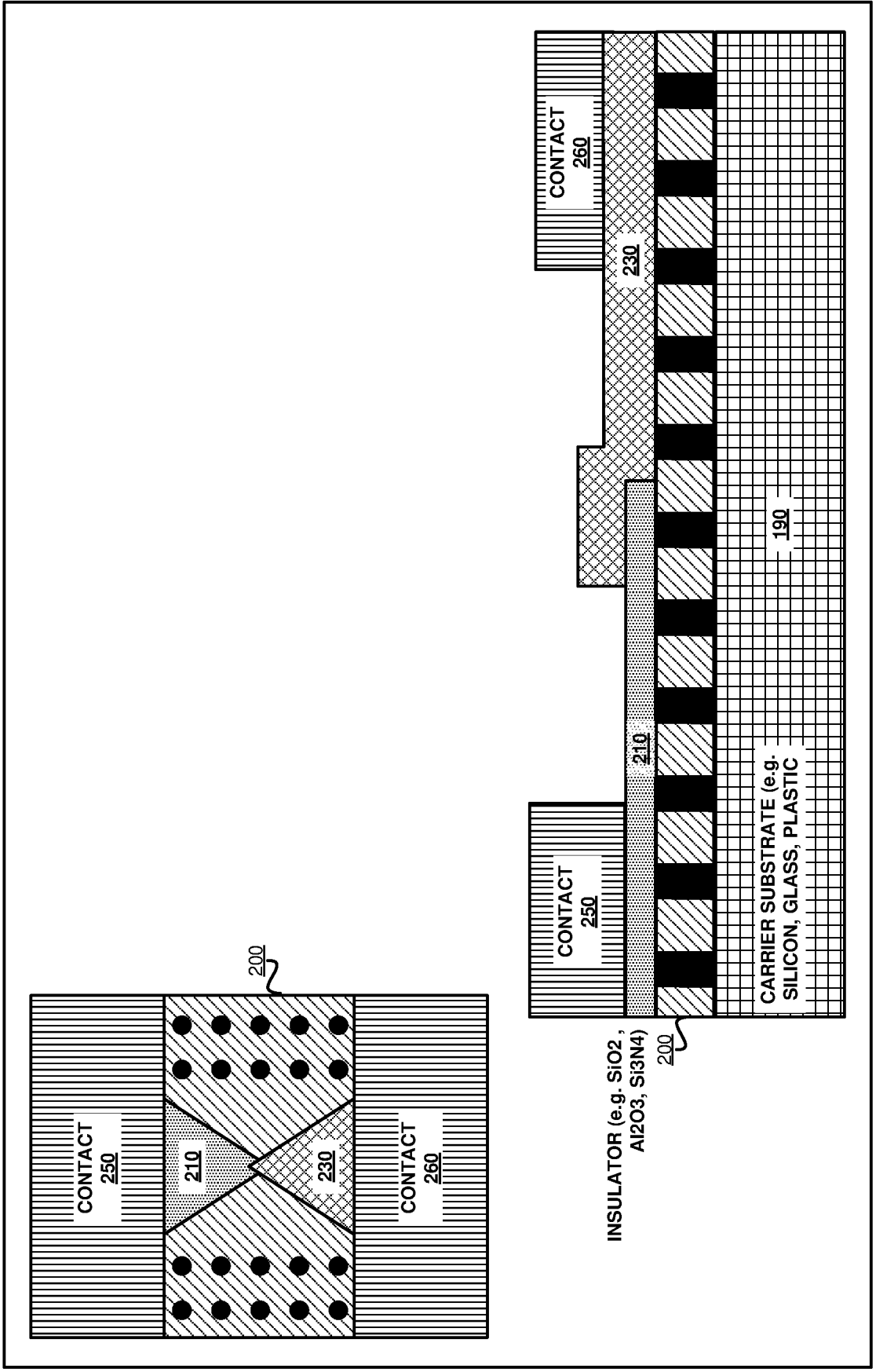
FIG. 13(B) depicts a structure for enhancing photon emission in accordance with an illustrative embodiment.

With reference to FIG. 13(B), the insulator 200 configured on the carrier substrate 190 has a plurality of other insulators that are configured within. As in FIG. 13(A), the lateral confinement of the of the overlap region of the first semiconductor device 210 and the second semiconductor device 230 provides a more localized region for photon emission. In addition, placing at least one of the other insulators underneath the overlapping region will also provide a more enhanced photon emission. The photon emission will be more enhanced with the other insulator underneath the overlap region than with the air holes described in FIG. 13(A). The combined effect of the lateral confinement and the additional insulator configured underneath the overlap region will provide a more localized and enhanced photon emission through the overlap region.

Figure 14A:
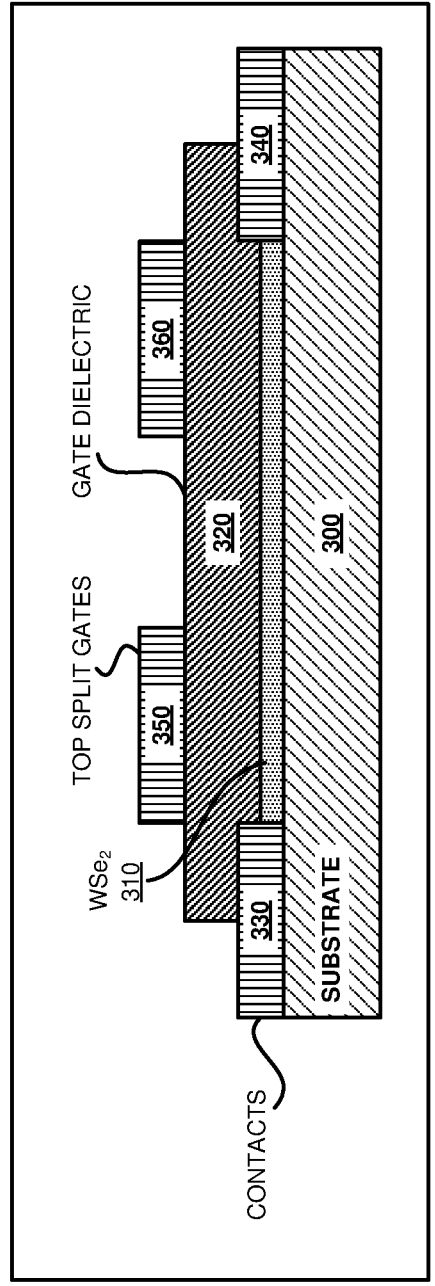
FIG. 14(A) depicts another structure of a quantum light emitting device in accordance with an illustrative embodiment.

With respect to FIG. 14(A), a quantum light emitting diode (QLED) device is depicted. A substrate 300 is shown, wherein a first semiconductor device 310 consisting of Tungsten Diselenide is configured over the substrate 300. A second semiconductor device 320 is configured over the first semiconductor device 310, with a first ground contact 330 configured next to one side of the first semiconductor device 310, and a second ground contract 340 configured next to the other side of the first semiconductor device 310. As described above in earlier embodiments, the first ground contract 330 will emit the negative charge and the second ground contact 340 will emit the positive charge. In other embodiments, the first ground contact 330 can be responsible for the positive charge while the second ground contact can be responsible for the negative charge. A first top split gate 350 is configured over the second semiconductor device 320. A second top slit gate 360 is also configured on the other side of the second semiconductor device 360. An overlapping region between the first semiconductor device 310 and the second semiconductor device 320 is confined to the region between the two top split gates 350, 360 wherein the photon emission will occur within this overlapping region.

The overlap region between the first top slit gate 350 and the second top slit gate 360 can be narrowed when required to create a more localized overlap region. The more localized region allows for more enhanced photon emission through the overlap region. Adjusting or reconfiguring the positions of both the first top split gate 350 and the second top split gate 360 provides a more localized overlap region, which allows for more enhanced photon emission through the overlap region.

Figure 14B:
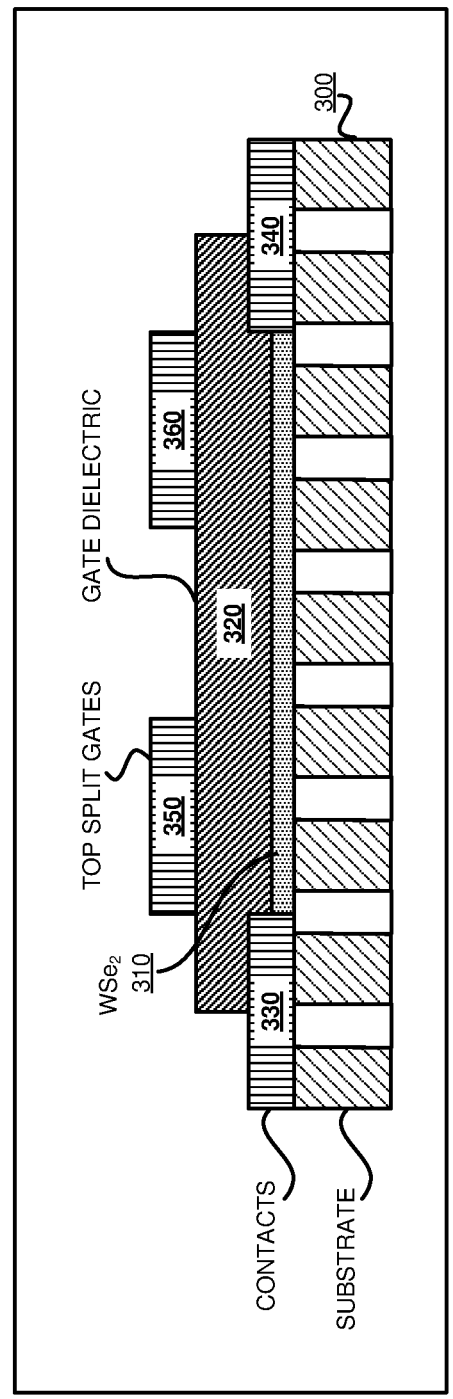
FIG. 14(B) depicts another example of a quantum light emitting device in accordance with an illustrative embodiment.

With reference to FIG. 14(B), while having a similar configuration to FIG. 14(A) described above, the substrate 300 is also filled with a plurality of air holes to allow for the photon emission through the overlap region to be more enhanced. As in earlier embodiments described above, one or more of the plurality of air holes is configured under the overlap region between the first semiconductor device 310 and the second semiconductor device 320. The air holes positioned underneath the overlap region provide a more localized region for the photon emission to occur through the overlap region. The combined effect of the first top split gate 350 and the second top split gate 360 providing lateral confinement, and the air holes configured underneath the overlap region provides a more localized and enhanced photon emission through the overlap region.

Figure 14C:
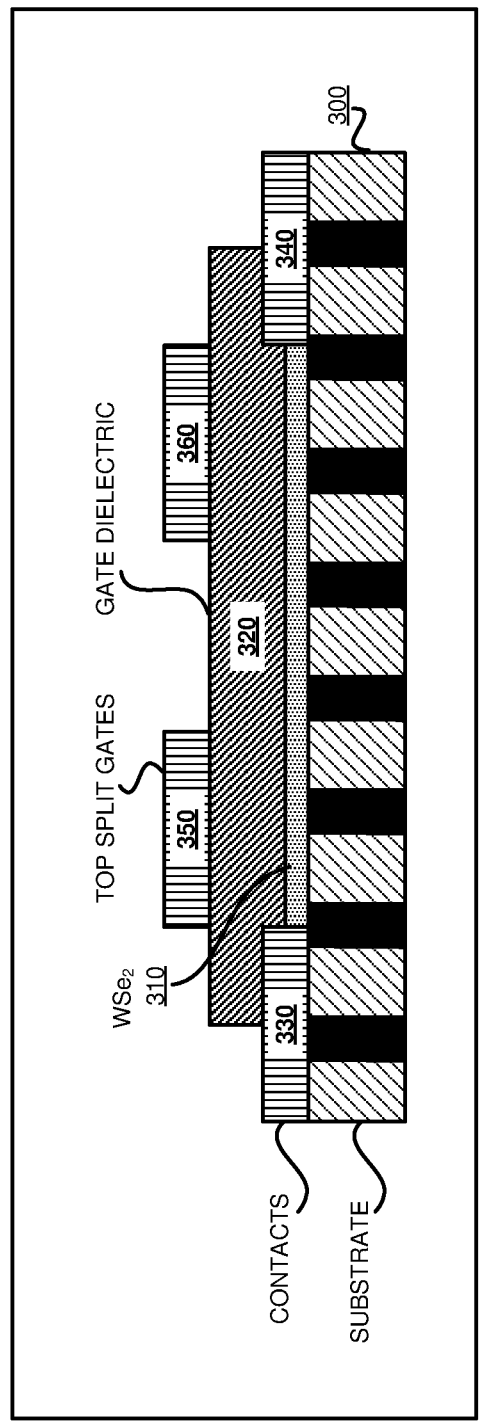
FIG. 14(C) depicts an example of an additional structure of a quantum light emitting device in accordance with an illustrative embodiment.

With respect to FIG. 14(C), a similar configuration of a QLED device is depicted. A first top split gate 350 and a second top split gate 360 provide lateral confinement of the overlap region between the first semiconductor device 310 and the second semiconductor device 320. An additional insulator is configured within the substrate 300. Further, the additional insulator is also placed underneath the overlap region. The additional insulator provides greater localization and enhancement for the photon emission then the plurality of air holes described above. One or more of the additional insulators are positioned underneath the overlap region between the first semiconductor device 310 and the second semiconductor device 320. The additional insulator within the substrate 300 enables the photon emission through the overlap region to be more localized and enhanced.

Figure 15:
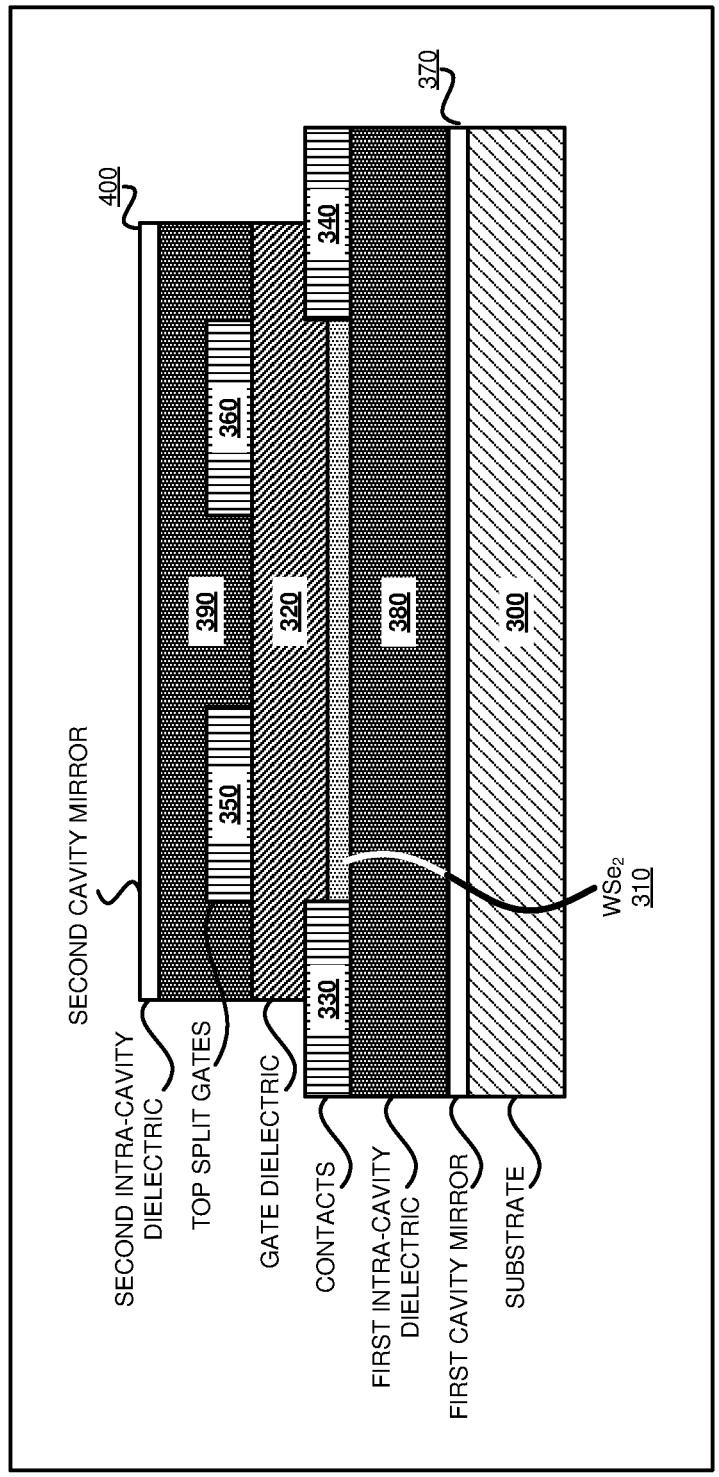
FIG. 15 depicts another example of a quantum light emitting structure in accordance with an illustrative embodiment.

With reference to FIG. 15, another QLED device according to an illustrative embodiment is depicted. While having similar configurations as FIGS. 14(A)-(C), additional features such as a first cavity mirror 370, a first intra-cavity dielectric 380, second intra-cavity dielectric 390, and second cavity mirror 400 are depicted. Portions of the first cavity mirror 370 and the first intra-cavity dielectric 380 are positioned underneath the overlap region between the first semiconductor device 310 and the second semiconductor device 320. In addition, portions or regions of the second intra-cavity dielectric 390 and the second cavity mirror 400 are configured above the overlap region between the first semiconductor device 310 and the second semiconductor device 320. The combined effect of the first cavity mirror 370, first intra-cavity dielectric 380, second intra-cavity dielectric 390 and second cavity mirror 400 configured above and below the overlap region respectively provide spatial filters for the photon emission through the overlap region.

Figure 16:
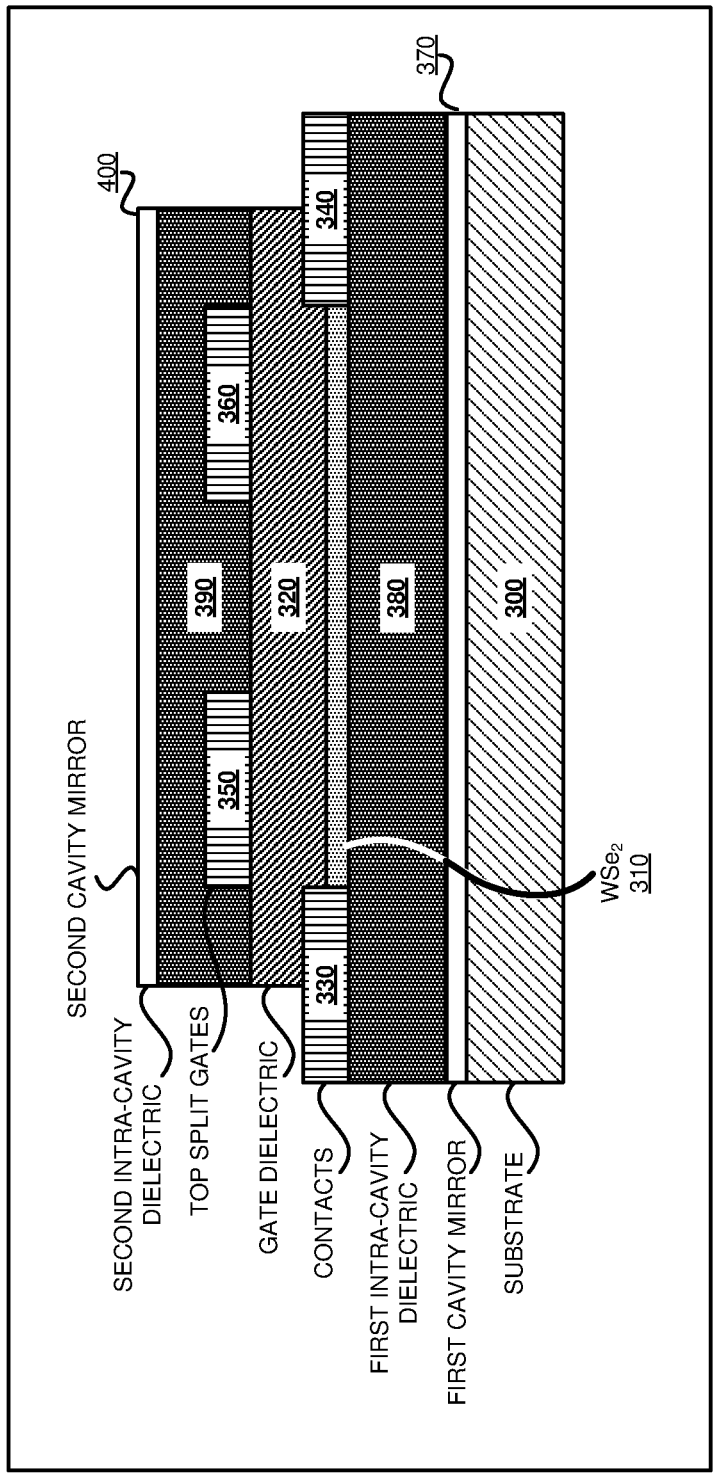
FIG. 16 depicts a structure for a enhanced photon emission in accordance with an illustrative embodiment.

With respect to FIG. 16, the QLED device depicted has substantially similar configurations to the QLED device shown in FIG. 15. The first cavity mirror 370 and the second cavity mirror 400 are made of Gold (Au). The first cavity mirror 370 has a thickness of thirty nanometers (nm), while the second cavity mirror 400 has a thickness of sixty nanometers (nm). In other embodiments, the first cavity mirror 370 and the second cavity mirror 400 are Bragg reflectors. The first semiconductor device 310 is made of Tungsten Diselenide. Further, the first intra-cavity dielectric 380, second semiconductor device 320, and second intra-cavity dielectric 390 are made of Aluminum Oxide. The combined thickness of the first intra-cavity dielectric 380, second semiconductor device 320, and second intra-cavity dielectric 390 determines the cavity resonance wavelength. The materials of the first cavity mirror 370, second cavity mirror 400, first intra-cavity dielectric 380 and second intra-cavity dielectric 390 being within the overlap region provide hard spatial filters for the photon emission that leads to an enhanced photon emission within the overlap region.

Figure 17:
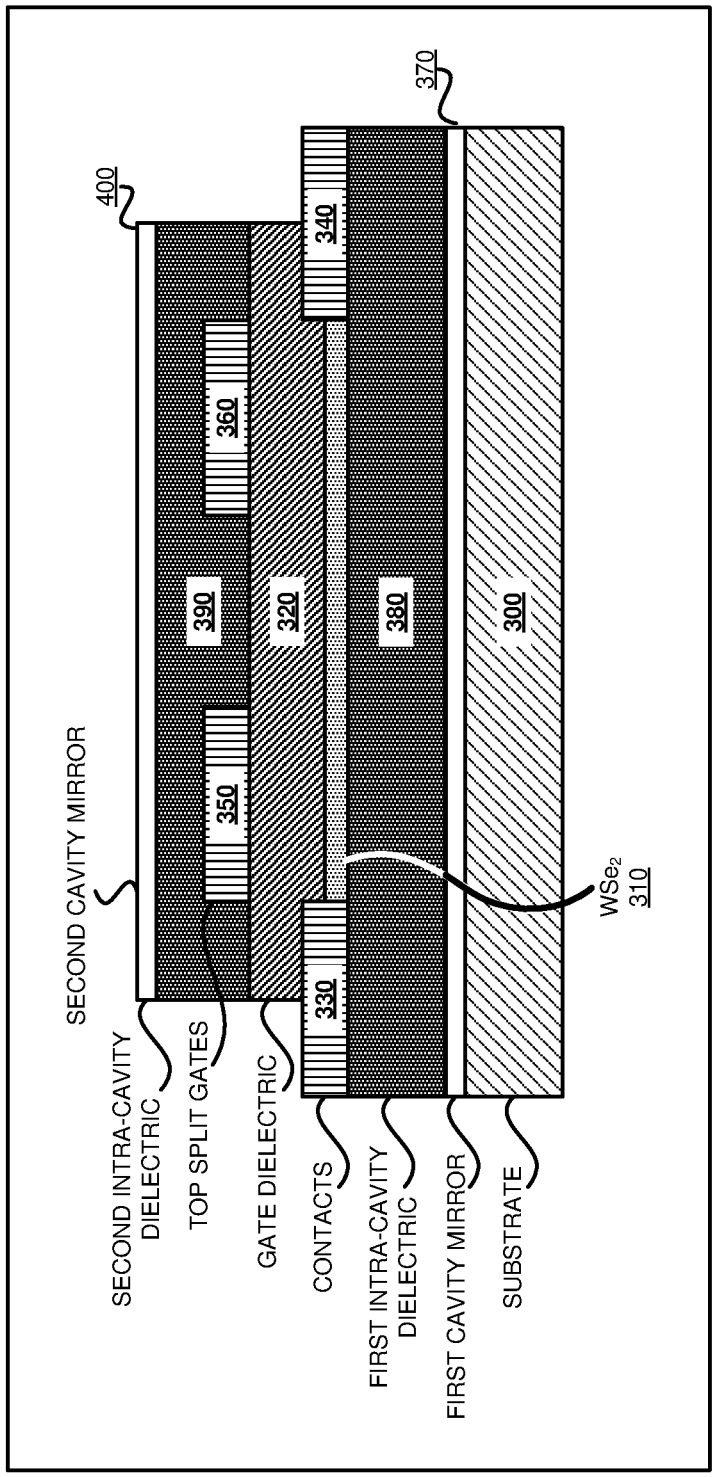
FIG. 17 depicts another structure for enhanced photon emission in accordance with an illustrative embodiment.

With reference to FIG. 17, the configurations of the QLED device are substantially similar to those of FIGS. 15-16. The emission wavelength of the photons of the Tungsten Diselenide is 750 nm. The combined dielectric thickness for the first intra-cavity dielectric 380, second intra-cavity dielectric 390 and second semiconductor device 320 is equal to 158 nm. This combined thickness matches the emission wavelength of the Tungsten Diselenide. For the combined dielectric thickness to match the emission wavelength of the Tungsten Diselenide, the first intra-cavity dielectric 380 has to have a layer thickness of 90 nm, the second semiconductor device 320 has to have a layer thickness of 30 nm and the second intra-cavity dielectric 390 has to have a layer thickness of 49 nm.

Figure 18:
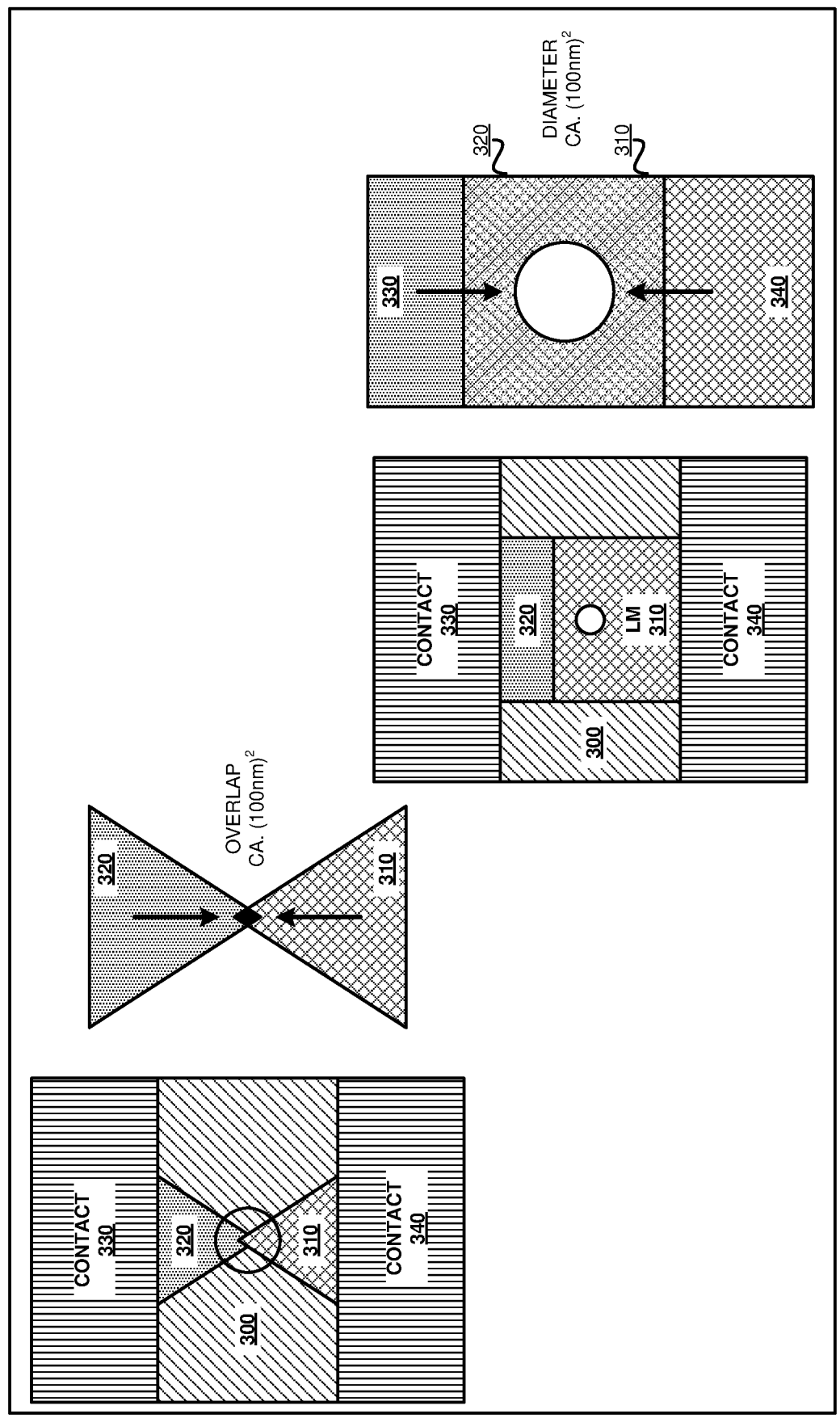
FIG. 18 depicts a region for photon emission in accordance with an illustrative embodiment.

With respect to FIG. 18, a design constraint for achieving single photon emission is depicted. The active area needs to be spatially confined at the overlap region where the first semiconductor device 310 and the second semiconductor device 320 (first layered material LMI and second layered material LMII) overlap. The active area is spatially confined at the overlap region by reducing the overlap region between the first semiconductor device 310 and the second semiconductor device 320 to an area smaller than a critical area (of the order of 100×100 nm). Another way to spatially confine the active area to the overlap region is by substrate induced localization such as with an integrated local pillar structure or a two-dimensional photonic crystal that is configured below the overlap region, similar to the additional insulators or air holes described above in earlier embodiments. Yet a further way to spatially confine the active area to the overlap region is by spatially filtering the photon emission through a mask, cavity mirrors or dielectrics that cover the overlapping region described in embodiments above. Any of the methods or a combination of one or more of the methods described above are used to confine the active area within the overlap region to further localize and enhance the single photon emission through the overlap region.

Figure 19:
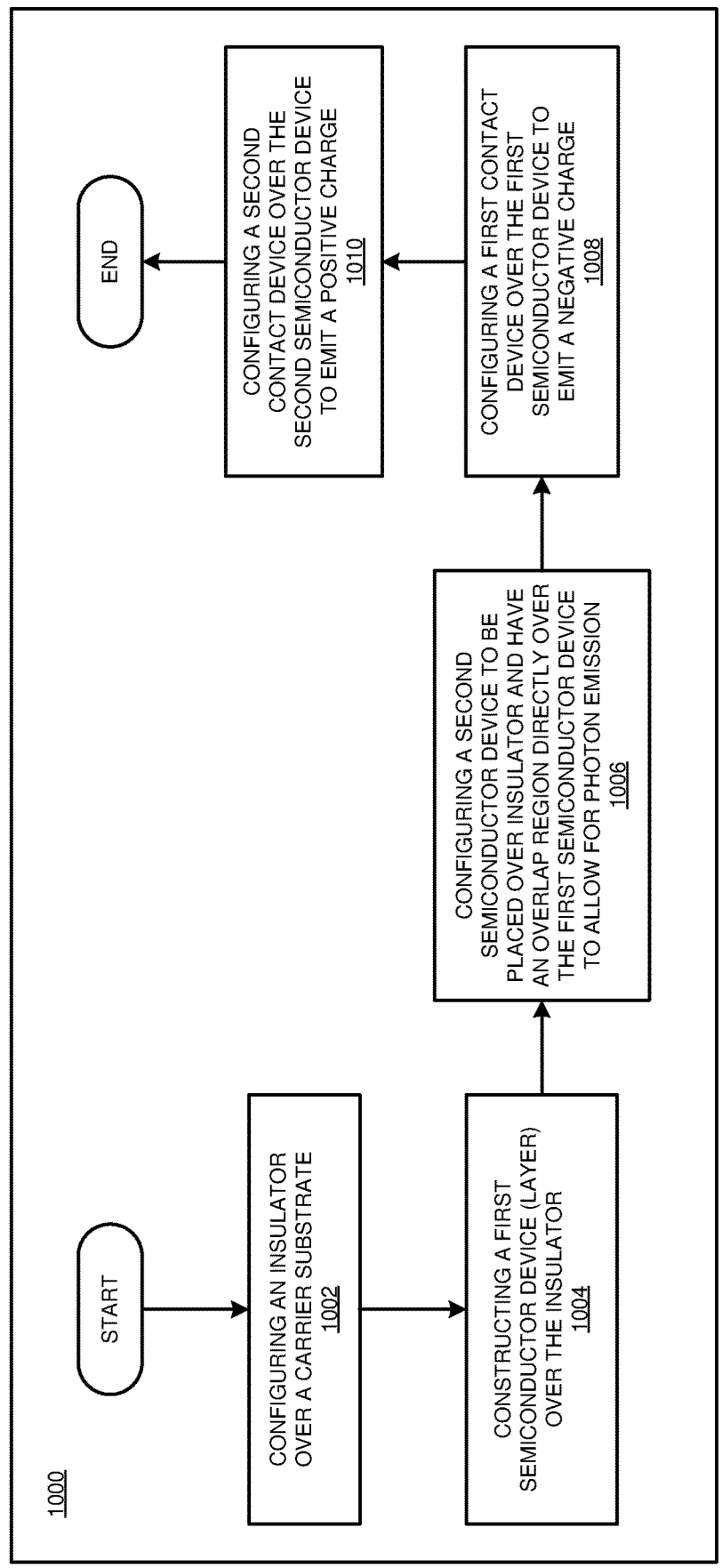
FIG. 19 depicts a flowchart of an example process for forming a QLED device with an illustrative embodiment.

With reference to FIG. 19, this figure depicts a flow chart of an example process for configuring one or more of the QLED devices described above. Process 1000 can be implemented in FIG. 1 in a manner described herein.

The main insulator is configured over the carrier substrate (block 1002). The first semiconductor device is configured over the main insulator and the carrier substrate (block 1004). The second semiconductor device is placed over the main insulator and has an overlap region over the first semiconductor device (block 1006). The overlap region is present to provide an area for the single photon emission. A first contact device is positioned over the first semiconductor device to emit a negative charge (block 1008). Finally, a second contact device is configured over the second semiconductor device to emit a positive charge (block 1010).

Various embodiments of the present invention are described herein with reference to the related drawings. Alternative embodiments can be devised without departing from the scope of this invention. Although various connections and positional relationships (e.g., top, bottom, over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum light emitting device, comprising:
   a carrier substrate comprising silicon and configured with an electrically insulating top surface;
   an insulator configured on the carrier substrate;
   a first semiconductor structure comprising a first semiconductor material configured on the insulator;
   a second semiconductor structure comprising a second semiconductor material configured on the insulator, with an overlap region of the second semiconductor structure electrically coupling with the first semiconductor structure, a dimensional characteristic of the overlap region being configured to limit a photon emission from the overlap region to a single photon;
   a first contact electrically coupled with the first semiconductor structure to provide a negative charge at the overlap region; and
   a second contact electrically coupled with the second semiconductor structure to provide a positive charge at the overlap region.

2. The quantum light emitting device of claim 1, wherein light is emitted over the overlap region between the second semiconductor structure and the first semiconductor structure.

3. The quantum light emitting device of claim 1, further comprising:
   a set of voids configured in the insulator, wherein a void in the set of void is configured to enhance photon emission in the overlap region by causing the photon emission in the overlap region to be further localized.

4. The quantum light emitting device of claim 3, wherein a void from the set of voids is axially aligned with the overlap region.

5. The quantum light emitting device of claim 1, wherein the insulator is configured with an additional insulator in a set of voids within the insulator to further localize the single photon emission in the overlap region.

6. The quantum light emitting device of claim 1, wherein the insulator is configured with a set of voids to enhance or to localize the single photon emission in the overlap region.

7. The quantum light emitting device of claim 1, wherein a dimension of the overlap region is adjusted between the first semiconductor structure and the second semiconductor structure to further localize the photon emission.

8. The method of claim 1, further comprising:
   configuring an other insulator in a set of voids within the first insulator to further enhance the photon emission.

9. The method of claim 8, further comprising:
   configuring the other insulator in the set of voids to be axially aligned with the overlap region to further localize the photon emission.

10. A method for enhancing photon emission in a quantum light emitting device, the method comprising:
    configuring an insulator on a top surface a carrier substrate made of silicon;
    placing a first semiconductor structure comprising a first semiconductor material on the insulator;
    configuring a second semiconductor structure comprising a second semiconductor material on the insulator, with an overlap region of the second semiconductor structure electrically coupling with the first semiconductor structure, a dimensional characteristic of the overlap region being configured to limit a photon emission from the overlap region to a single photon;
    configuring a first contact to electrically couple with the first semiconductor structure to provide a negative charge at the overlap region; and
    configuring a second contact to electrically couple with the second semiconductor structure to provide a positive charge at the overlap region.

11. The method of claim 10, further comprising:
    configuring a set of voids in the insulator, wherein a void among the set of voids is axially aligned with the overlap region to further localize the photon emission.

12. The method of claim 10, further comprising:
    modifying a dimension of the overlap region to further localize the photon emission.

13. The method of claim 10, further comprising:
    placing a mask on the overlap region to spatially filter the photon emission.

14. The method of claim 10, further comprising:
    placing one or more masks within the overlap region to spatially filter the photon emission.

15. A photon emission system comprising:
    a first semiconductor structure comprising a first semiconductor material configured on an insulator;
    a second semiconductor structure comprising a second semiconductor material configured on the insulator, with an overlap region of the second semiconductor structure electrically coupling with the first semiconductor structure, a dimensional characteristic of the overlap region being configured to limit a photon emission from the overlap region to a single photon;
    a first contact electrically coupled to the first semiconductor structure to provide a negative charge to the overlap region;
    a second contact electrically coupled to a second semiconductor structure figured configured on the carrier substrate provide a positive charge to the overlap region;
    a first semiconductor device configured over the carrier substrate and in contact with the first contact device and the second contact device;
    a first split gate configured on the second semiconductor structure on one side of the overlap region; and
    a second split gate configured on the second semiconductor structure on another side of the overlap region.

16. The photon emission system of claim 15, further comprising:
    a set of voids configured within an insulator that includes an other insulator in the set of voids to further localize the single photon emission.

17. The photon emission system of claim 16, wherein a void among the set of voids configured with another insulator is axially aligned with the overlap region.

18. The photon emission system of claim 15, further comprising:

adjusting a dimension of the overlap region to further localize the photon emission.

19. The photon emission system of claim 15, further comprising:
configuring a mask over the overlap region to spatially filter the single photon emission.

20. The photon emission system of claim 19, wherein the mask includes a metal layer with an aperture having a diameter equal to a diameter of the overlap region.

* * * * *